(12) United States Patent
Yamanaka

(10) Patent No.: US 10,811,805 B2
(45) Date of Patent: Oct. 20, 2020

(54) CONNECTOR BOX AND METHOD OF ITS ASSEMBLY

(71) Applicant: HOSIDEN CORPORATION, Osaka (JP)

(72) Inventor: Satoshi Yamanaka, Osaka (JP)

(73) Assignee: Hosiden Corporation, Osaka (JP)

(*) Notice: Subject to any disclaimer, the term of this patent is extended or adjusted under 35 U.S.C. 154(b) by 118 days.

(21) Appl. No.: 16/141,212

(22) Filed: Sep. 25, 2018

(65) Prior Publication Data

US 2019/0103699 A1    Apr. 4, 2019

(30) Foreign Application Priority Data

Sep. 29, 2017 (JP) ................................. 2017-190924
Sep. 29, 2017 (JP) ................................. 2017-190925
Sep. 29, 2017 (JP) ................................. 2017-190926

(51) Int. Cl.
  *H01R 13/502* (2006.01)
  *H01R 13/631* (2006.01)
  (Continued)

(52) U.S. Cl.
  CPC ......... *H01R 13/502* (2013.01); *H01R 13/516* (2013.01); *H01R 13/631* (2013.01);
  (Continued)

(58) Field of Classification Search
  CPC .... H05K 5/0047; H05K 5/0052; H01R 24/54; H01R 13/502; H01R 13/717; H01R 13/7172
  (Continued)

(56) References Cited

U.S. PATENT DOCUMENTS 5,957,728 A * 9/1999 Wu ...................... H05K 5/0204
                                                439/638
6,213,815 B1* 4/2001 Wu ........................ H01R 27/02
                                                439/502
(Continued)

FOREIGN PATENT DOCUMENTS

CN    1101593900 A    12/2009
EP       1575344 A1    9/2005
(Continued)

OTHER PUBLICATIONS

European Search Report dated May 22, 2019.
European Search Report dated Feb. 18, 2019.

*Primary Examiner* — Abdullah A Riyami
*Assistant Examiner* — Marcus E Harcum
(74) *Attorney, Agent, or Firm* — Dilworth & Barrese, LLP

(57) ABSTRACT

Provided is a connector box having high durability. The connector box includes a receptacle connector portion having a connector insertion opening into which a plug connector is inserted from the front side, a circuit board unit having the receptacle connector portion at a front end of a circuit board, a casing configured to accommodate the circuit board unit with the connector insertion opening being opened to the outside. The casing includes a lower casing for covering a lower face of the circuit board unit and an upper casing for covering an upper face of the circuit board unit and engaged with the lower casing. In association with sliding of the upper casing to one side in the front/rear direction, the upper casing is engaged with the lower casing.

18 Claims, 9 Drawing Sheets

(51) Int. Cl.
*H01R 24/62* (2011.01)
*H01R 13/66* (2006.01)
*H01R 13/6581* (2011.01)
*H01R 13/516* (2006.01)
*H05K 5/00* (2006.01)
*H01R 31/06* (2006.01)
*H01R 13/717* (2006.01)

(52) U.S. Cl.
CPC ....... *H01R 13/6581* (2013.01); *H01R 13/665* (2013.01); *H01R 24/62* (2013.01); *H05K 5/0013* (2013.01); *H05K 5/0052* (2013.01); *H05K 5/0069* (2013.01); *H01R 13/7175* (2013.01); *H01R 31/065* (2013.01)

(58) Field of Classification Search
USPC .......................... 439/490, 638, 634, 724, 904
See application file for complete search history.

(56) References Cited

U.S. PATENT DOCUMENTS

| | | | | |
|---|---|---|---|---|
| 6,290,533 | B1* | 9/2001 | Major | H01R 13/652 |
| | | | | 362/253 |
| 6,319,066 | B2* | 11/2001 | Kuo | H01R 13/6215 |
| | | | | 439/638 |
| 6,416,090 | B1 | 7/2002 | Schechtel et al. | |
| 6,488,542 | B2* | 12/2002 | Laity | H01R 27/02 |
| | | | | 361/679.32 |
| 6,626,703 | B2* | 9/2003 | Hsin | H01R 13/6658 |
| | | | | 439/500 |
| 6,948,949 | B1* | 9/2005 | Schwartz | H01R 9/2491 |
| | | | | 439/638 |
| 7,011,550 | B1* | 3/2006 | Lai | H01R 27/02 |
| | | | | 439/638 |
| 7,059,913 | B1* | 6/2006 | Chen | H01R 31/06 |
| | | | | 439/638 |
| 7,497,738 | B2* | 3/2009 | Kuo | H01R 29/00 |
| | | | | 439/638 |
| 7,666,007 | B2* | 2/2010 | Hsu | H01R 13/6658 |
| | | | | 235/492 |
| 7,722,363 | B2* | 5/2010 | Zhou | H01R 12/515 |
| | | | | 439/490 |
| 8,149,594 | B2* | 4/2012 | Nishihata | H05K 9/002 |
| | | | | 174/250 |
| 9,028,122 | B2* | 5/2015 | Tuchrelo | H01R 13/7175 |
| | | | | 362/253 |
| 9,160,118 | B2* | 10/2015 | Tuchrelo | H01R 13/665 |
| 9,531,137 | B2* | 12/2016 | Zhou | H01R 13/7172 |
| 9,660,395 | B2* | 5/2017 | Yeom | H01R 13/46 |
| 9,819,128 | B2* | 11/2017 | Zhou | H01R 13/7175 |
| 2007/0007287 | A1 | 1/2007 | Seo et al. | |
| 2007/0059975 | A1* | 3/2007 | Walsh | H01R 13/6691 |
| | | | | 439/490 |
| 2007/0249216 | A1* | 10/2007 | Cheng | H01R 7/02 |
| | | | | 439/490 |
| 2008/0096437 | A1* | 4/2008 | Kuo | H01R 9/03 |
| | | | | 439/701 |
| 2009/0148107 | A1 | 6/2009 | Hashiguchi | |
| 2011/0256769 | A1* | 10/2011 | Wu | H01R 13/6658 |
| | | | | 439/620.02 |
| 2013/0058044 | A1* | 3/2013 | Watanabe | H05K 5/006 |
| | | | | 361/714 |
| 2013/0070432 | A1* | 3/2013 | Kawai | H05K 5/0052 |
| | | | | 361/752 |
| 2015/0229083 | A1 | 8/2015 | Bopp | |
| 2015/0289399 | A1* | 10/2015 | Liao | H05K 7/1417 |
| | | | | 361/747 |
| 2015/0380879 | A1 | 12/2015 | Tuchrelo et al. | |
| 2016/0044799 | A1* | 2/2016 | Igari | H05K 5/006 |
| | | | | 361/752 |
| 2016/0149353 | A1* | 5/2016 | Chen | H01R 13/6675 |
| | | | | 439/490 |
| 2016/0157364 | A1* | 6/2016 | Blossfeld | H01R 12/00 |
| | | | | 361/736 |
| 2016/0172795 | A1 | 6/2016 | Zhou et al. | |
| 2016/0254612 | A1 | 9/2016 | Andrei et al. | |
| 2016/0344145 | A1* | 11/2016 | Zhou | H01R 13/7175 |
| 2016/0372857 | A1* | 12/2016 | Wu | H01R 13/7172 |
| 2017/0155237 | A1 | 6/2017 | Kobayashi et al. | |
| 2018/0177067 | A1* | 6/2018 | Manushi | H05K 1/181 |
| 2018/0241162 | A1* | 8/2018 | Skinner | H01R 13/7175 |
| 2018/0376604 | A1* | 12/2018 | Ohyama | B60R 16/0215 |

FOREIGN PATENT DOCUMENTS

| | | | |
|---|---|---|---|
| EP | 2835876 A1 | 5/2013 | |
| EP | 3089296 A1 | 11/2016 | |
| JP | 2002-075559 A | 3/2002 | |
| JP | 2003-263252 A | 9/2003 | |
| JP | 2008-147077 A | 6/2008 | |
| JP | 2013165107 A * | 8/2013 | .......... H05K 5/0052 |
| JP | 2016-046062 A | 4/2016 | |
| WO | WO-03079741 A1 * | 9/2003 | .......... H05K 5/0013 |

* cited by examiner

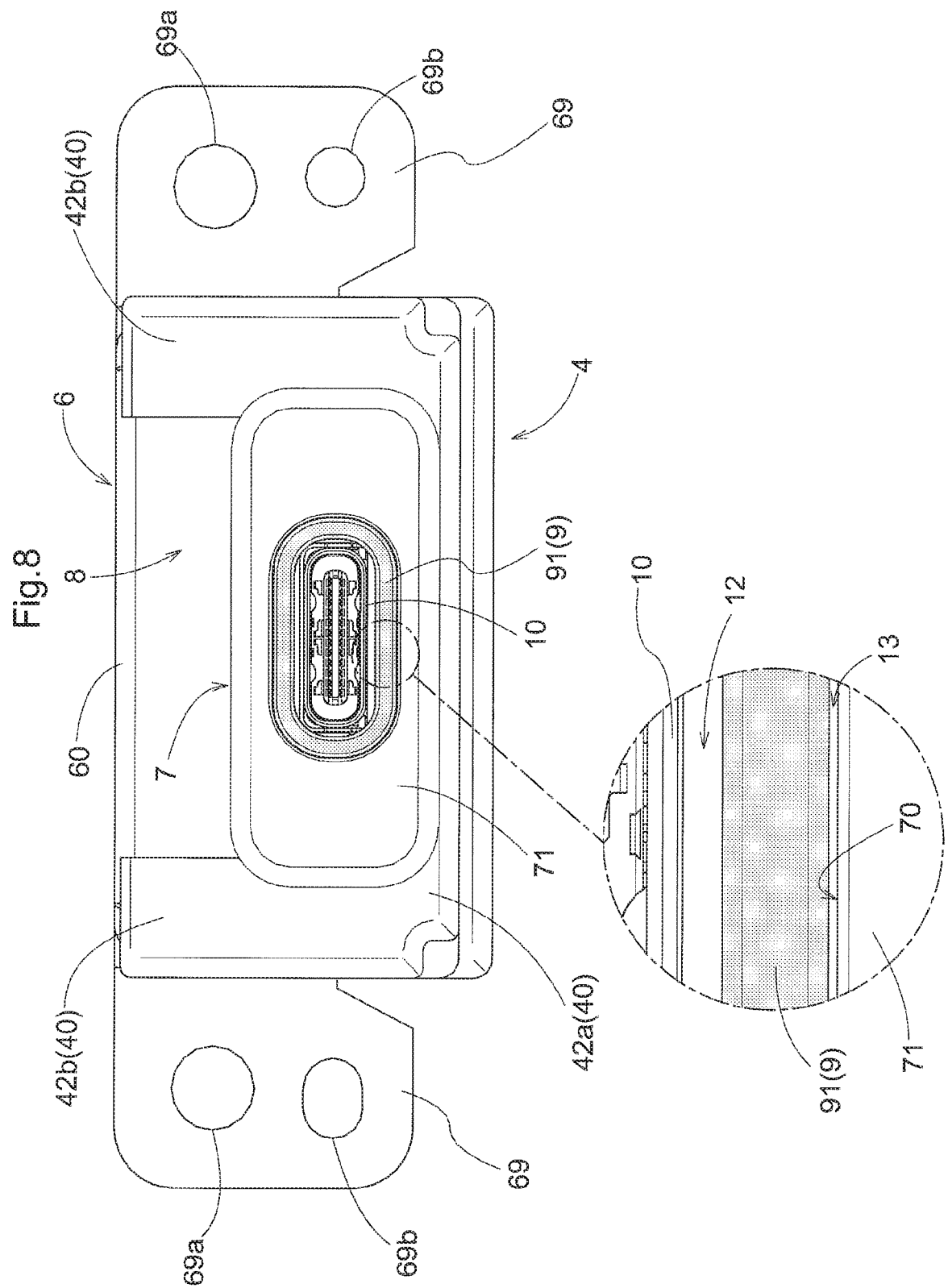

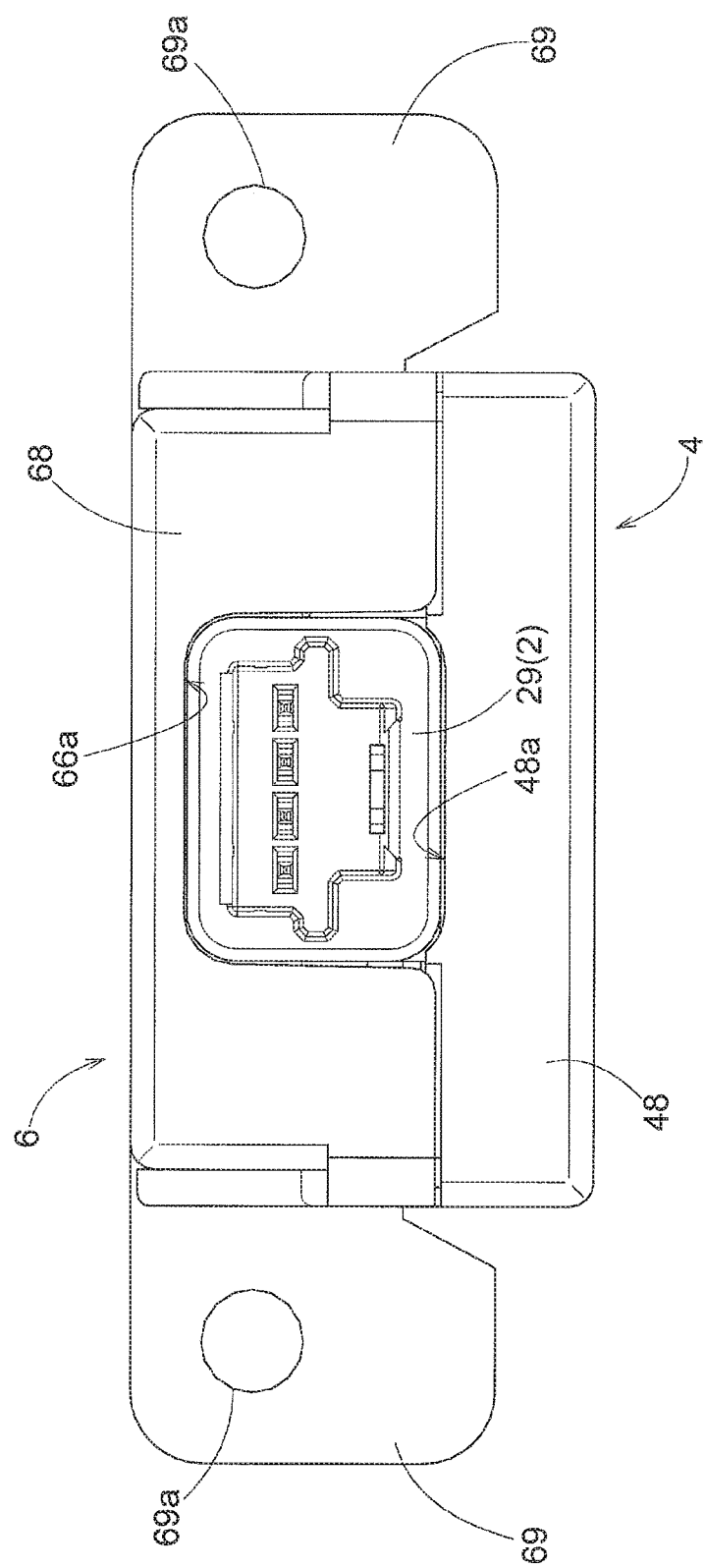

CONNECTOR BOX AND METHOD OF ITS ASSEMBLY

CROSS REFERENCE TO RELATED APPLICATIONS

This application is based on and claims priority under 35 U.S.C. Section 119 to Japanese Patent Applications No. 2017-190924, No. 2017-190925 and No. 2017-190926 filed on Sep. 29, 2017, the entire contents of which are incorporated herein by reference.

TECHNICAL FIELD

This disclosure relates to a connector box and a method of its assembly.

RELATED ART

There is growing opportunity to use a device (to be referred to as a "power consuming device" hereinafter) that requires electric power supply inside a cabin of a vehicle such as a car (an automobile). As a power source interface of such power consuming device for use inside a vehicle cabin, an opportunity to employ a connector unit under the so-called USB (Universal Serial Bus) standard has been increasing significantly. This is because the USB standard connector unit has a high versatility, not limited to its use in a vehicle cabin.

Japanese Unexamined Patent Application Publication No. 2003-263252 discloses a USB hub for in-car use which is configured e.g. to obtain electric power from an onboard (car-mounted) DC power source (so-called cigar socket) and to supply this electric power via a USB standard socket (so-called a receptacle connector) to a power consuming device having a USB standard plug (this process will be referred to as "USB power supply" hereinafter). This USB hub for in-car use is not installed inside a car initially. But, for use of a power consuming device, the power plug of the in-car use USB hub, to be put into use, will be inserted into a cigar socket provided initially inside the car body.

Japanese Unexamined Patent Application Publication No. 2016-46062 describes an in-car use USB terminal device. This in-car use USB terminal device is provided in advance as an onboard device in e.g. a dashboard of a driver's seat and used for USB power supply or the like.

Japanese Unexamined Patent Application Publication No. 2008-147077 describes a need for ease of satisfactory operation even inside a dim car cabin. And, in order to provide a car-mounted electronic device having improved operability of USB connector (so-called receptacle connector), the above document discloses an onboard electronic device characterized by a USB connector disposed with its connection inlet oriented toward the inside of car cabin, and an illuminating means for illuminating inside of the USB connector.

Here, receptacle connectors in general have a problem of durability due to repeated insertion/withdrawal operations of their plug connectors. For instance, Japanese Unexamined Patent Application Publication No. 2002-075559 discloses a problem that a connector jack (receptacle connector) mounted on a circuit board can be readily detached from the circuit board due to repeated insertion/withdrawal of the plug connector or prying load application. And, in an attempt to resolve this problem, the document proposes a mounting arrangement of a connector jack that can improve the durability against the plug insertion/withdrawal and the prying load application. This Japanese Unexamined Patent Application Publication No. 2002-075559 discloses a connector jack mounting arrangement capable of improving durability against plug insertion/withdrawal or prying load application through reinforcement of the connector jack to be mounted on a circuit board. In particular, Japanese Unexamined Patent Application Publication No. 2002-075559 discloses a mounting arrangement having a reinforcing member provided with a shape to cover an outer circumference of the connector jack (receptacle connector) and also with an attaching portion to the circuit board. Specifically, there is disclosed an exemplary mounting arrangement in which the connector jack is mounted on the surface of the circuit board and the reinforcing member covers the outer circumference of this connector jack and the attaching portion of the reinforcing member is fixed to the circuit board.

SUMMARY

The car-mounted USB hub disclosed in JP No. 2003-263252 provides feel of secure since it can be replaced easily in the event of its failure. However, this is inconvenient in case the power consuming device is used frequently in a car, because this car-mount USB hub needs, in order to be ready for use, to be connected to a cigar socket as the onboard DC power source on each occasion of use.

The car-mounted USB terminal device disclosed in JP No. 2016-46062 provides high convenience for user in case the power consuming device is frequently used in a car. However, in the case of using a power consuming device in a car, various inconveniences exist since the car cabin is not necessarily a large space. For instance, the body of a passenger such as a driver can come into contact with the plug inadvertently. Moreover, since the plug needs to be inserted/withdrawn by the passenger who remains seated (a condition of the passenger's posture being restricted inside the car cabin), this passenger may inadvertently apply a force to the plug in a direction off the proper insertion/withdrawal direction of the plug (prying direction). Furthermore, when the user inserts the plug into the receptacle connector, he/she may insert it to an excessive degree.

As described above, when a power consuming device is used in a car cabin, an excessive external force may be applied in a direction to "pry" the connected plug. And, application of such excessive external force in the prying direction will damage the receptacle connector and/or a container housing this receptacle connector, thus possibly presenting a cause for its failure. And, in case of failure of the car-mounted USB terminal device mounted as an onboard device in advance, replacement thereof is not so easy as the car-mounted USB hub device disclosed in JP2003-263252, thus being inconvenient.

Therefore, in view of convenience for a passenger, there is a need for a connector box such as a connector device, having higher prying load resistance against failure in the event of application of an excessive external force thereto in the prying direction in onboard use for instance.

Further, since inside of a car cabin is often dim as described in JP No. 2008-147077, there is a need for better visibility of the receptacle connector to such a degree as to provide ease of satisfactory operation even in a dim car cabin. This is because poor visibility of the receptacle connector does not allow accurate or proper insertion of the plug by a user such as a driver. However, in the case of the car-mounted electronic device disclosed in JP No. 2008-147077, the technique lies only in positive illumination of inside of a receptacle connector, so the outer contour of the receptacle connector may not be visually recognized sufficiently. Thus, in case the receptacle connector is inserted in a forcible manner in an inappropriate direction, an excessive force will be applied to the receptacle connector, thus possibly damaging this receptacle connector.

As described above, when an electric power consuming device is used in a car cabin, an excessive external force may be applied in a direction to pry the connected plug. And, as discussed in JP No. 2002-075559, application of such excessive external force in the prying direction can damage the receptacle connector and/or a container housing this receptacle connector, thus possibly presenting a cause for its failure. And, in case of failure of the car-mounted USB terminal device mounted as an onboard device in advance, replacement thereof is not so easy as the car-mounted USB hub device disclosed in JP2003-263252, thus being inconvenient.

Therefore, in view of convenience for a user, there is a need for a connector box such as a connector device that allows appropriate insertion of the plug even in in-car use thereof for instance.

With the receptacle connector mounting arrangement disclosed in JP No. 2002-075559, durability of the receptacle connector portion in the car-mounted USB terminal device is improved and the risk of occurrence of failure can be reduced. However, in a use environment such as use in a car cabin where excessive external force can often be applied to the connected plug connector such as in-car use, sufficient durability can sometimes be not obtained.

Therefore, in view of convenience for a passenger, there is a need for a connector box such as a connector device, having higher durability sufficient to withstand repeated application of excessive external force thereto such as in an in-car use.

The present disclosure has been made in view of the state of the art described above and its object is to provide a connector box having higher prying load resistance and a method of its assembly. Another object thereof is to provide a connector box having better visibility even in a dim surrounding, thus ensuring proper insertion of the plug thereto. Still another object thereof is to provide a connector box with higher durability.

According to a characterizing feature of the present disclosure for accomplishing the above-noted object, a connector box comprises:

a receptacle connector portion having a connector insertion opening into which a plug connector is inserted from the front side;

a circuit board unit having the receptacle connector portion at a front end of a circuit board;

a casing configured to accommodate the circuit board unit with the connector insertion opening being opened to the outside;

the casing including a lower casing for covering a lower face of the circuit board unit and an upper casing for covering an upper face of the circuit board unit and engaged with the lower casing;

the lower casing having a bottom plate portion opposed to the lower face of the circuit board unit, a pair of lower side wall portions formed vertically from the bottom plate portion and a pair of first engaging portions formed in the lower side wall portions on the side opposite to the bottom plate portion; and the lower casing holding the upper casing non-detachably in a vertical direction in association with sliding of the upper casing to one side in the front/rear direction to fit into a space surrounded by the pair of first engaging portions, the lower side wall portions and the bottom plate portion.

With the above-described arrangement, the upper casing is held non-detachably in a vertical direction by the lower casing in association with sliding of this upper casing to one side in the front/rear direction to fit into a space surrounded by the pair of first engaging portions, the lower side wall portions and the bottom plate portion. Namely, as the upper casing slides in the front/rear direction which is a direction perpendicular to the vertical direction of the circuit board, this upper casing comes into engagement with the lower casing, and the upper casing is restrained by the pair of engaging portions not to be moved in the vertical direction of the circuit board relative to the lower casing.

Therefore, when an external force in the vertical direction which is a prying direction off the insertion/withdrawal direction of the plug is applied to the plug connector and this external force is transmitted to the circuit board via the receptacle connector portion and then this circuit board transmits the force in the vertical direction to the upper casing or the lower casing, this will not lead to easy detachment of the upper casing from the lower casing. This is because the first engaging portions receives this vertical force to restrain the upper casing in the vertical direction, thus holding it non-detachably. Therefore, according to the above-described arrangement, it is possible to provide a connector box having high prying load resistance to prevent detachment between the upper casing and the lower casing in the event of application of an external force to the plug connector in the vertical direction.

Incidentally, the above-described arrangement does not require forcible engagement of the upper casing to the lower casing against the first engaging portions. Therefore, the upper casing can be readily attached to the lower casing. Thus, the arrangement does not impair ease of assembly in spite of the high prying load resistance arrangement of the connector box.

According to a further characterizing feature of the connector box relating to the present disclosure:

the upper casing includes a top plate portion covering the circuit board unit; and the top plate portion includes a pair of first engaged portions engageable with the pair of first engaging portions.

With the above-described arrangement, the upper casing is engaged with the first engaging portions via the first engaged portions of the top plate portion thereof, thus being restrained to the lower casing via the top plate portion. Thus, the upper casing is held non-detachably in the vertical direction relative to the lower casing.

According to a still further characterizing feature of the connector box relating to the present disclosure:

the lower casing includes a front face plate portion having an opening portion into which the receptacle connector portion is inserted and which opens the connector insertion opening to the outside of the casing;

the opening portion is spaced from an entire outer circumference of the receptacle connector portion; and the upper casing is disposed rearwardly of the front face plate portion.

With the above-described arrangement, the connector box can be configured with the front face plate portion constituting a front face of the connector box, i.e. its interface portion to be subjected to a user's operation. And, as the opening portion of the receptacle connector is opened to be exposed to the outside via this front face plate portion, into/from which the plug connector can be inserted and withdrawn.

Moreover, since the opening portion is spaced from the entire outer circumference of the receptacle connector portion, there is formed a gap extending along the entire outer circumference of the receptacle connector between the outer circumference of the receptacle connector portion and the inner circumference of the opening portion. Thus, even when a vertical external force is applied to the plug connector, it is possible to prevent a resultant force from this plug connector from being transmitted to the front face plate portion having the opening portion. This is because in the event of strain deformation occurring in the circuit board unit due to application of an external force to the plug connector, such deformation can be absorbed by the gap formed between the outer circumference of the receptacle connector portion and the opening portion.

And, with the above-described arrangement for preventing application of a force to the front face plate portion, aesthetics of the front face plate portion can be enhanced. This is because in aesthetic designing of the front face plate portion, such design placing priority on the aesthetics of the front face plate portion is possible in contrast with a designing of the front face plate portion taking force transmitted from the plug connector into consideration. Therefore, it becomes possible to enhance the aesthetics performance with improvement of the prying load resistance of the connector box.

According to a still further characterizing feature of the connector box relating to the present disclosure:

the lower casing includes, rearwardly of the first engaging portions, a second engaging portion for holding the upper casing non-removably in the vertical direction; and the upper casing includes a second engaged portion engageable with the second engaging portion.

With the above-described arrangement, the lower casing can hold the upper casing non-detachably in the vertical direction of the circuit board, additionally via the second engaging portion. More particularly, when the upper casing is to be engaged with the lower casing, not only the engagement between the first engaging portions and the first engaged portions, but also engagement between the second engaging portion and the second engaged portion is possible rearwardly of the first engaging portions (first engaged portions).

Therefore, the first engaging portions and the second engaging portion can respectively receive in distribution the vertical force applied to the plug connector. Thus, the lower casing can retrain the upper casing in the vertical direction at two separate front/rear portions. So, the lower casing can hold the upper casing non-detachably in the vertical direction.

For accomplishing the above-noted further object, according to a characterizing feature of an assembly method of a connector box relating to the present disclosure, there is provided an assembly method of a connector box comprising:

a receptacle connector portion having a connector insertion opening into which a plug connector is inserted from the front side;

a circuit board unit having the receptacle connector portion at a front end of a circuit board;

a casing configured to accommodate the circuit board unit with the connector insertion opening being opened to the outside;

the casing including a lower casing for covering a lower face of the circuit board unit and an upper casing for covering an upper face of the circuit board unit and engaged with the lower casing; and the lower casing having a bottom plate portion opposed to the lower face of the circuit board unit, a pair of lower side wall portions formed vertically from the bottom plate portion and a pair of first engaging portions formed in the lower side wall portions on the side opposite to the bottom plate portion, the assembly method comprising the step of sliding the upper casing to one side in the front/rear direction to fit into a space surrounded by the pair of first engaging portions, the lower side wall portions and the bottom plate portion, so that the lower casing holds the upper casing non-detachably in a vertical direction.

With the above-described arrangement, it is possible to assemble a connector box having high prying load resistance by a simple procedure, while retaining the above-described advantageous effects of the connector box. In this assembly of the connector box, by sliding the circuit board unit together with the upper casing in the front/rear direction (to the front side for example) to be fitted in the space surrounded by the first engaging portions, the lower side wall portions and the bottom plate portion, the upper casing can be easily attached to the lower casing. Moreover, when the upper casing is to be attached to the lower casing, there is no need to apply a force in the vertical direction to the first engaging portions. Therefore, the circuit board unit can be smoothly accommodated in the casing.

According to a further characterizing feature of the assembly method of a connector box relating to the present disclosure:

the lower casing includes a front face plate portion having an opening portion into which the receptacle connector portion is inserted and which opens the connector insertion opening to the outside of the casing; and when the upper casing together with the circuit board unit are slid forwardly to be fitted between the pair of first engaging portions and the bottom plate portion, the receptacle connector portion is inserted into the opening portion.

With the above-described arrangement, the connector box can be assembled with the front face plate portion constituting the front face thereof. And, the connector insertion opening can be exposed to the outside from this font face plate portion. Therefore, the plug connector can be easily assembled in such a manner that it can be inserted/withdrawn into/from the connector insertion opening via the opening portion with the front face plate portion forming the front face.

For accomplishing the above-noted still further object, according to a characterizing feature of an connector box relating to the present disclosure, the connector box comprises:

a receptacle connector portion having a connector insertion opening into which a plug connector is inserted from the front side;

a circuit board unit having the receptacle connector portion at a front end of a circuit board;

a casing configured to accommodate the circuit board unit with the connector insertion opening being opened to the outside;

a light guiding lens for guiding light to the outside of the casing;

the light guiding lens including an annular portion fitted to an outer side of the receptacle connector portion and a pair of retaining portions extending rearwards from the annular portion;

the circuit board unit including a light emitting portion disposed in an upper face portion of the circuit board and optically coupled with at least one of the pair of retaining portions;

the casing including a lower casing for covering a lower face of the circuit board unit and an upper casing for covering an upper face of the circuit board unit and engaged with the lower casing, the circuit board unit being fixed to the upper casing;

the upper casing having a front end wall and a retaining hole extending through the front end wall in a front/rear direction; and the light guiding lens being mounted to the upper casing with the retaining portions thereof being inserted in the retaining hole.

With the above-described arrangement, the light guiding lens is mounted to the upper casing with the retaining portions thereof being inserted in the retaining hole of this upper casing. And, as the retaining hole extends through the front end wall in the front/rear direction, optical coupling is established between the light guiding lens and the inside (inner side) of the upper casing (casing) via the retaining portions inserted in the retaining hole. Namely, the light guiding lens can guide light via the retaining portions from the inside to the outside of the casing.

Moreover, with the above-described arrangement, the circuit board unit is fixed to the upper casing and a light emitting portion is provided in an upper face portion of the circuit board of the circuit board unit. Therefore, in the upper face portion of the circuit board of the circuit board unit, the light emitting portion is covered by the upper casing. Namely, the light emitting portion is disposed inside the upper casing. This means that the retaining hole is communicated to the light emitting portion. Thus, when light is emitted by the light emitting portion inside the upper casing (casing), this light is guided to the light guiding lens via the retaining portions optically coupled with the inside of the upper casing.

Moreover, with the above-described arrangement, in the light guiding lens, its annular portion is fitted to an outer side of the receptacle connector portion. Therefore, when the light emitting portion emits light inside the upper casing, this can illuminate the annular portion of the light guiding lens. Namely, in the outer circumference of the connector insertion hole, the annular portion of the light guiding lens is illuminated. With this, even in a dim surrounding, the visibility of the connector insertion opening is improved for a user who is to insert the plug connector into the connector insertion opening from the front side.

Therefore, when a user is to insert the plug connector into the connector insertion opening from the front side, he/she can insert the plug connector appropriately with a proper orientation. Thus, it is possible to reduce the risk of application of an external force in a direction off the insertion/withdrawal direction of the plug connector, i.e. the front/rear direction, to the receptacle connector portion from the plug connector. Consequently, the risk of occurrence of a trouble such as inadvertent detachment of the receptacle connector portion from the circuit board leading to damage of the receptacle connector portion can be reduced.

Furthermore with the above-described arrangement, the retaining portions of the light guiding lens are inserted in the retaining hole which extends through along the front/rear direction. Therefore, even if a force is applied to the receptacle connector portion in the front/rear direction when a user inserts the plug connector into the connector insertion opening from the front side, the retaining portions function to "ward off" this force in the front/rear direction along the retaining hole. Thus, it is possible to reduce the risk of occurrence of such trouble as application of such force to the light guiding lens leading to damage of this light guiding lens. Consequently, with the above-described arrangement, it is possible to provide a connector box having high durability.

According to a further characterizing feature of the connector box relating to this disclosure:

the light emitting portion is provided on at least one of left and right outer sides of the receptacle connector portion; and the retaining portions are disposed in opposition to the light emitting portion.

With the above-described arrangement, since the retaining portions are disposed in opposition to the light emitting portion, light emitted by the light emitting portion can be made incident on the retaining portions in an efficient manner. Thus, a larger amount of light can be guided from the retaining portions to the annular portion, thus illuminating this annular portion more brightly. Therefore, the visibility of the connector insertion hole for the user can be further improved.

According to a still further characterizing feature of the connector box relating to the present disclosure:

the annular portion includes an annular lens portion fitted to an outer side of the receptacle connector portion and a light guiding edge portion extending to an outer side in a circumferential direction from the annular lens portion;

the upper casing includes a receptacle connector accommodating portion for accommodating at least a portion of the receptacle connector portion;

the lower casing includes a front face plate portion having an opening portion into which the receptacle connector portion is inserted and which opens the connector insertion opening to the outside of the casing; and the light guiding lens is fixed to the casing with the light guiding edge portion thereof being clamped between the front end wall and the front face plate portion.

With the above-described arrangement, the light guiding lens can be fixed to the casing as being clamped between the front end wall of the upper casing and the front face plate portion of the lower casing in the front/rear direction. Therefore, even if an external force is applied from the plug connector to the receptacle connector portion at the time of insertion of the plug connector into the connector insertion opening or under the condition of the plug connector being inserted in the connector insertion opening and such external force is transmitted via the circuit board unit to the upper casing, the light guiding lens will be allowed to be shifted between the front end wall and the front face plate portion (namely, a "floating arrangement" is provided). Therefore, the light guiding lens can ward off a force perpendicular to the front/rear direction.

According to a still further characterizing feature of the connector box relating to the present disclosure, the receptacle connector accommodating portion includes a side wall portion between a side wall portion of the receptacle connector portion and the light emitting portion.

With the above-described arrangement, it is possible to avoid illumination of the light from the light emitting portion on the receptacle connector portion. Therefore, it is possible to reduce leakage of light from the connector insertion opening of the receptacle connector portion. Thus, the aesthetics of the connector box is improved. Moreover, since lighting contrast between the connector insertion opening and the light guiding lens is improved, the visibility for the user can be even further improved.

According to a still further characterizing feature of the connector box relating to the present disclosure, the annular lens portion is fitted to an inner side of the opening portion and the opening portion is spaced from the annular lens portion for the entire outer circumference of the lens portion of the annular portion.

With the above-described arrangement, a gap is formed between the opening portion and the outer side of the annular lens portion. Therefore, even if an external force is applied to the receptacle connector portion and this external force is transmitted to the annular lens portion, transmission of this force to the opening portion can be inhibited by the gap present between the opening portion and the outer side of the annular lens portion. Therefore, such external force applied to the receptacle connector portion will not provide a stress (strain stress) to the annular lens portion.

According to a still further characterizing feature of the connector box relating to the present disclosure, the annular lens portion is spaced from the receptacle connector portion along an entire outer circumference of the receptacle connector portion.

With the above-described arrangement, a gap is formed between the inner side of the annular lens portion and the receptacle connector portion. Therefore, even if an external force is applied to the receptacle connector portion and this external force is transmitted to the annular lens portion, transmission of this force can be inhibited by the gap present between the annular lens portion and the receptacle connector portion. Therefore, such external force applied to the receptacle connector portion will not provide a stress (strain stress) to the annular lens portion.

For accomplishing the still further object noted above, according to a characterizing feature of a connector box relating to the present disclosure, a connector box comprises:

a receptacle connector portion having a connector insertion opening into which a plug connector is inserted from the front side;

a circuit board unit having the receptacle connector portion at a front end of a circuit board;

a casing configured to accommodate the circuit board unit with the connector insertion opening being opened to the outside;

the casing including a lower casing for covering a lower face of the circuit board unit and an upper casing for covering an upper face of the circuit board unit and engaged with the lower casing, the circuit board unit being fixed to the upper casing;

the upper casing having a receptacle connector accommodating portion for accommodating at least a portion of the receptacle connector portion; and the receptacle connector accommodating portion having a far-side wall portion which comes into abutment against a connector rear end face which is a rear face of the receptacle connector portion.

With the above-described arrangement, the circuit board unit, as being fixed to the upper casing, is accommodated in the casing formed of this upper casing and the lower casing. And, at least a portion of the receptacle connector portion mounted to the front end of the circuit board is accommodated in the receptacle connector accommodating portion. In this, the receptacle connector accommodating portion is provided in the same upper casing to which the circuit board unit is fixed. Therefore, with the above-described arrangement, the circuit board unit is supported to the upper casing with this circuit board unit being fixed to the upper casing and also with the receptacle connector portion mounted on the circuit board unit being accommodated in the receptacle connector accommodating portion.

In this way, in the receptacle connector accommodating portion, when the receptacle connector portion is to be supported to the upper casing, the far-side wall portion of the receptacle connector accommodating portion comes into abutment against a rear end face of the receptacle connector portion, whereby the receptacle connector portion is supported from its rear side toward the front side.

Therefore, even if an excessive force is applied inadvertently from the plug connector to the receptacle connector portion to the rear side when the plug connector is inserted from the front side, such force is received by the receptacle connector accommodating portion of the upper casing. Thus, it is possible to reduce the risk of occurrence of such trouble as detachment of the receptacle connector portion from the circuit board. Consequently, with the above-described arrangement, it is possible to provide a connector box having high durability.

According to a still further characterizing feature of the connector box relating to the present disclosure, the receptacle connector accommodating portion has an upper wall portion that comes into abutment against a connector upper wall face which is an upper face of the receptacle connector portion.

In this way, in the receptacle connector accommodating portion, when the receptacle connector portion is to be supported to the upper casing, the upper wall portion of the receptacle connector accommodating portion is brought into abutment against the upper wall face of the connector of the receptacle connector portion. With this, the receptacle connector portion can be supported from its upper side toward its lower side. Therefore, with the above-described arrangement, when the plug connector is inserted from the front side or under the state of the plug connector being inserted, a prying force applied inadvertently to the upper side from the plug connector to the receptacle connector portion is received by the upper wall portion of the receptacle connector accommodating portion. Thus, it is possible to reduce the risk of trouble such as detachment of the receptacle connector portion from the circuit board or damage of the receptacle connector portion. Consequently, with the above-described arrangement, it is possible to provide a connector box having high durability.

According to a still further characterizing feature of the connector box relating to the present disclosure, the receptacle connector accommodating portion has a side wall portion that comes into abutment against a connector side wall portion which is a side wall of the receptacle connector portion.

In this way, in the receptacle connector accommodating portion, when the receptacle connector portion is to be supported to the upper casing, the side wall portion of the receptacle connector accommodating portion is brought into abutment against the side wall of the connector of the receptacle connector portion. With this, the receptacle connector portion can be supported from from its left side to its right side and also from its right side to its left side. Therefore, with the above-described arrangement, when the plug connector is inserted from the front side or under the state of the plug connector being inserted, a prying force applied inadvertently to the left side or the right side from the plug connector to the receptacle connector portion is received by the side wall portion of the receptacle connector accommodating portion. Thus, it is possible to reduce the risk of trouble such as detachment of the receptacle connector portion from the circuit board or damage of the receptacle connector portion. Consequently, with the above-described arrangement, it is possible to provide a connector box having high durability.

According to a still further characterizing feature of the connector box relating to the present disclosure, the upper casing includes a pair of flanges having a through hole.

With the above-described arrangement, by inserting e.g. a screw in the through holes of the flanges, the connector box can be attached (mounted) to an attaching target (attaching target wall) such as a dashboard of a car. In this, since the flanges are included in the upper casing, an external force applied to the receptacle connector portion can be received by the flanges of the upper casing, so that the connector box as a whole can be made highly resistant against damage and the durability of the connector box can be enhanced.

BRIEF DESCRIPTION OF DRAWINGS

FIG. 8 is a front view showing the connector box relating to the embodiment, and FIG. 9 is a rear view showing the connector box relating to the embodiment.

DESCRIPTION OF EMBODIMENTS

[General Arrangement]

Based on FIGS. 1 through 9, a connector box 100 and its assembly method relating to an embodiment of the present disclosure will be explained.

In the following, firstly, with reference mainly to FIG. 1, a schematic arrangement of the connector box 100 will be explained. In the instant embodiment, the connector box 100 is an electric component for mounting a receptacle connector portion 1 to an attaching target wall (not shown). The connector box 100 is a connector device for electric power supply for supplying electric power to another device with a plug connector (not shown) of this another device being inserted to a connector insertion opening 11 of the receptacle connector portion 1. The connector box 100 is a car-mounted USB terminal device to be attached (mounted) to a e.g. a dashboard (an example of "attaching target wall", not shown) at a driver's seat of a car.

Figure 1:
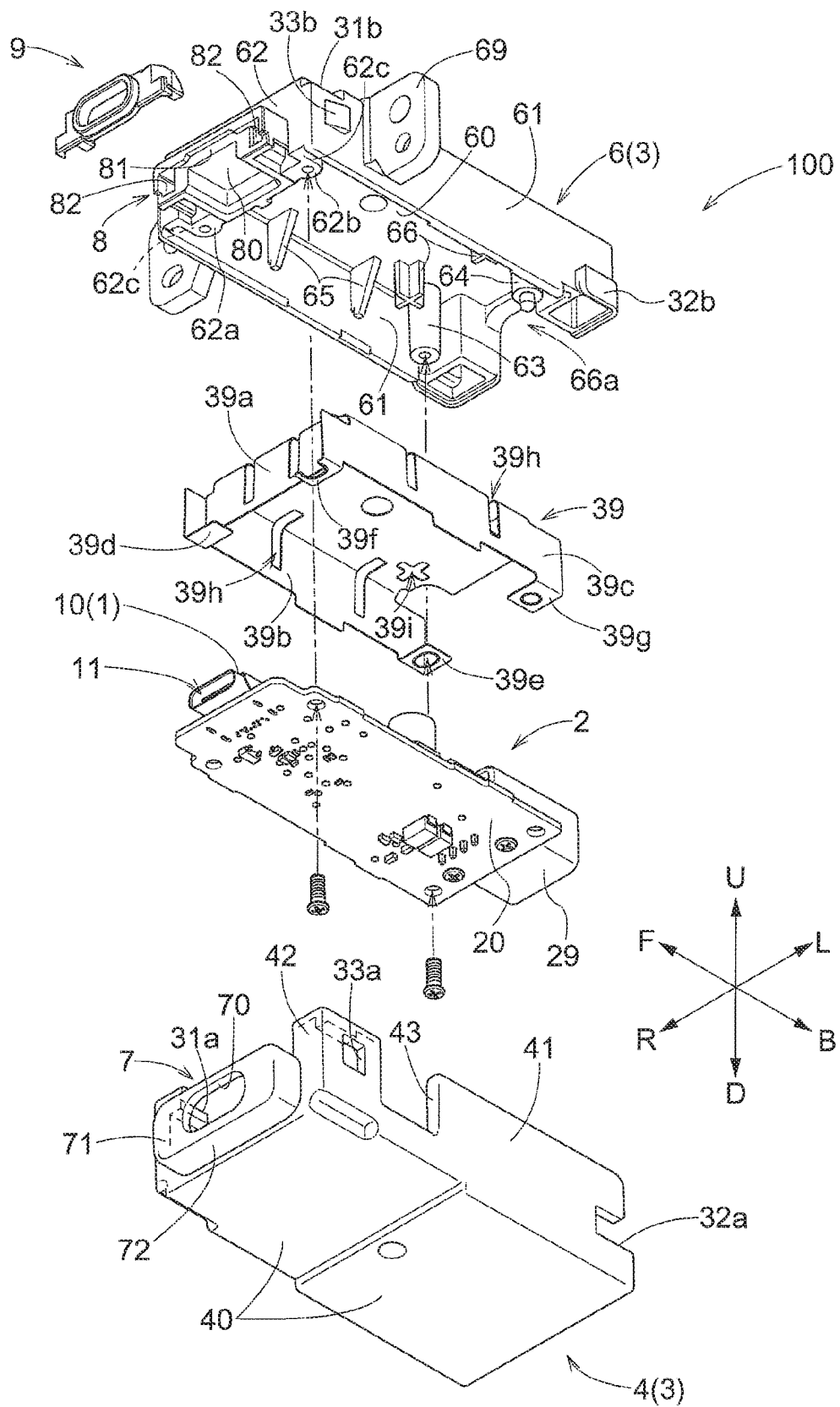
FIG. 1 is an exploded perspective view showing a general arrangement of a connector box relating to an embodiment.
Figure 2:
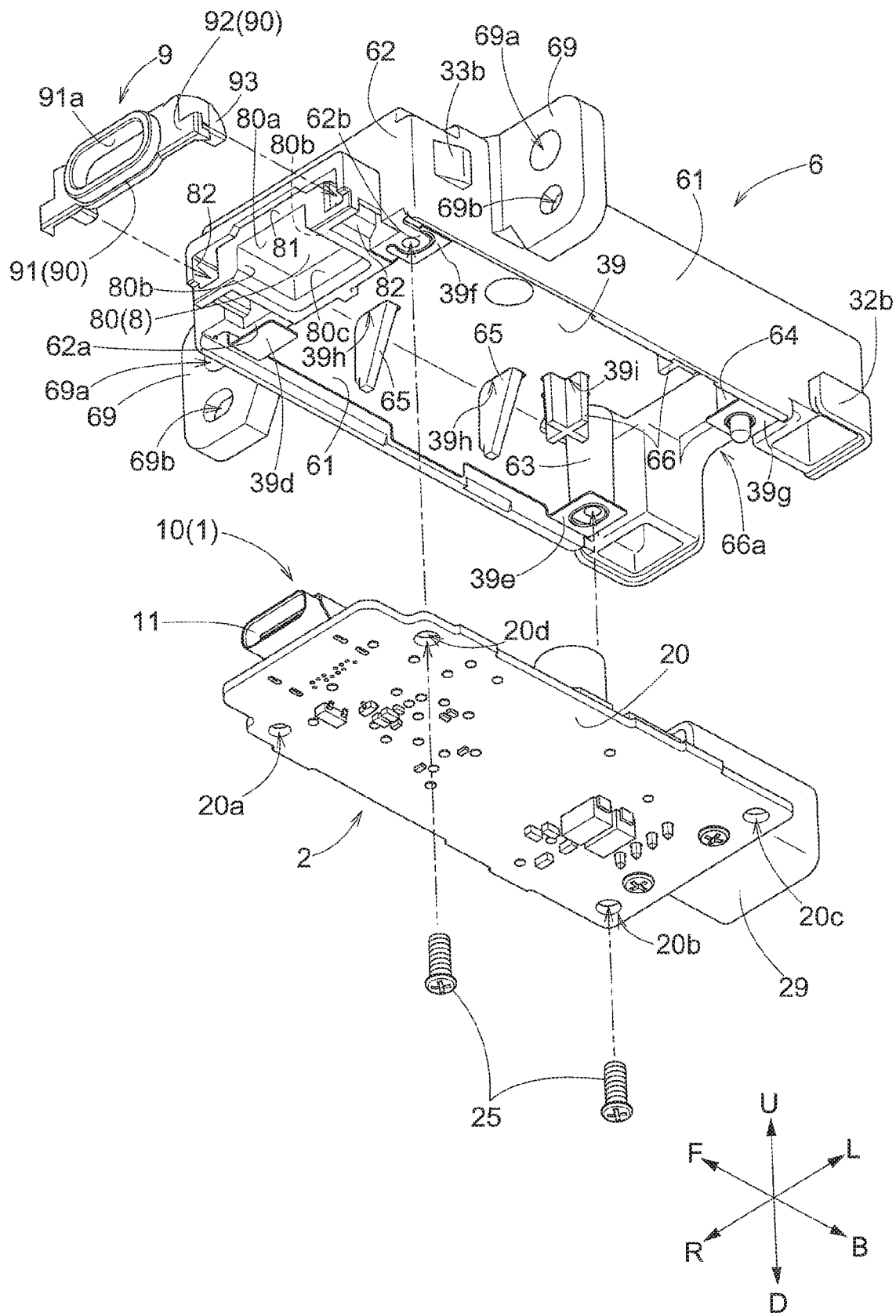
FIG. 2 is an exploded perspective view as seen from below illustrating a mounting method of a circuit board unit and a light guiding lens.

In the instant embodiment, in the definition of the front/rear directions of the connector box 100, as shown in FIG. 1 and FIG. 2, the direction from an input connector 29 to the receptacle connector portion 1 is defined as the front side F. Conversely, the direction from the receptacle connector portion 1 to the input connector 29 is defined as the rear side B. The front side F and the rear side B are parallel with the longitudinal direction of the connector box 100 as seen in a plan view thereof. The direction from the front side F to the rear side B is the front/rear direction. The direction perpendicular to the front/rear direction and extending toward a top plate portion 60 of an upper casing 6 and intersecting this top plate portion 60 perpendicularly is defined as the upper side U. The direction perpendicular to the front/rear direction and extending toward a bottom plate portion 40 of a lower casing 4 and intersecting this bottom plate portion 40 perpendicularly is defined as the lower side D. The direction from the upper side U to the lower side D is the upper/lower direction. In the direction perpendicular to the front/rear direction and the upper/lower direction, as seen toward the front side F, the left direction is defined as the left side L and the right direction is defined as the right side R. The direction from the left side L to the right side R is the left/right direction.

In the instant embodiment, the connector box 100 includes the receptacle connector portion 1 having the connector insertion opening 11 which is opened toward the front side F and into which a plug connector (not shown) is to be inserted, a circuit board unit 2 having the receptacle connector portion 1 at a front end of a circuit board 20, and a casing 3 for accommodating the circuit board unit 2 with the connector insertion opening 11 being opened to the outside.

In the instant embodiment, the connector box 100 further includes a light guiding lens 9. The light guiding lens 9 includes an annular portion 90 fitted to an outer side of the receptacle connector portion 1 and a pair of retaining portions 93 extending from the annular portion 90 to the rear side B.

The circuit board unit 2 further includes light emitting portions 21 on an upper face of the circuit board 20. In the instant embodiment, light emitted by the light emitting portions 21 inside the casing 3 is guided to the light guiding lens 9.

The casing 3 includes a lower casing 4 for covering a lower face of the circuit board unit 2 and an upper casing 6 for covering an upper face of the circuit board unit 2. The upper casing 6 is to be fitted to the lower casing 4.

The lower casing 4 includes a bottom plate portion 40 opposed to the lower face of the circuit board unit 2, a pair of lower side wall portions 41 formed vertically from the bottom plate portion 40 toward the upper side U and a pair of first engaging portions 31a formed in the lower side wall portions 41 on the side opposite to the bottom plate portion 40.

The upper casing 6 includes a top plate portion 60 covering the circuit board unit 2 and upper side wall portions 61 extending vertically from the top plate portion 60 to the lower side D. At the borders between the top plate portion 60 and the upper side wall portions 61, there are provided a pair of first engaged portions 31b engageable with the first engaging portions 31a. The upper casing 6 further includes a receptacle connector accommodating portion 8 for accommodating at least a portion of the receptacle connector portion 1. The receptacle connector accommodating portion 8 includes an far-side wall portion 80c which comes into abutment against a connector rear end face 10c (see FIG. 3) which is a rear face portion of the receptacle connector portion 1. The upper casing 6 further includes a front end wall 81 and retaining holes 82 formed in the front end wall 81 to extend therethrough along the front/rear direction. The light guiding lens 9 is mounted to the upper casing 6 with its retaining portions 93 being inserted to the retaining holes 82. The circuit board unit 2 is attached to this upper casing 6 to be fixed thereto.

When the upper casing 6 to which the circuit board unit 2 has been attached is to be engaged with the lower casing 4, the upper side wall portion 61 and the lower side wall portion 41 will be placed in opposition to each other, with the upper casing 6 being positioned on the rear side B relative to the lower casing 4. Then, the upper casing 6 will be slid to one side (the front side F in the instant embodiment) of the front/rear direction. With this, the first engaged portions 31b of the upper casing 6 will be fitted in the space surrounded by the first engaging portions 31a, the lower side wall portion 41 and the bottom plate portion 40. Under this state, the lower casing 4 holds the upper casing 6 non-detachably in the upper/lower direction (see FIG. 4).

In the instant embodiment, the lower casing 4 includes a front face plate portion 7 at the end of the front side F. The front face plate portion 7 includes an opening portion 70 into which the receptacle connector portion 1 is inserted and which opens the connector insertion opening 11 to the outside of the casing 3.

Further, in the instant embodiment, there is illustrated a case wherein the connector box 100 includes the light guiding lens 9 and a shield 39.

Additional explanation will be made next, respecting disposing of the respective portions of the connector box 100. The respective portions of the connector box 100 are disposed in the order of the upper casing 6, the shield 39, the circuit board unit 2 and the lower casing 4, from the upper side U to the lower side D in the upper/lower direction.

Further, the respective portions of the connector box 100 are disposed in the order of the front face plate portion 7, the light guiding lens 9, the receptacle connector portion 1, and the upper casing 6, from the front side F to the rear side B in the front/rear direction.

The connector box 100 will be mounted (mounted in a car) under a state wherein the front face plate portion 7 is exposed on the dashboard and the remaining portion of the connector box 100 (casing 3) present on the rear side B of the front face plate portion 7 is accommodated inside the dashboard.

[Detailed Arrangements]

Next, the respective portions of the connector box 100 will be described in details.

[Circuit Board Unit and Components Mounted on Circuit Board Unit]

Figure 3:
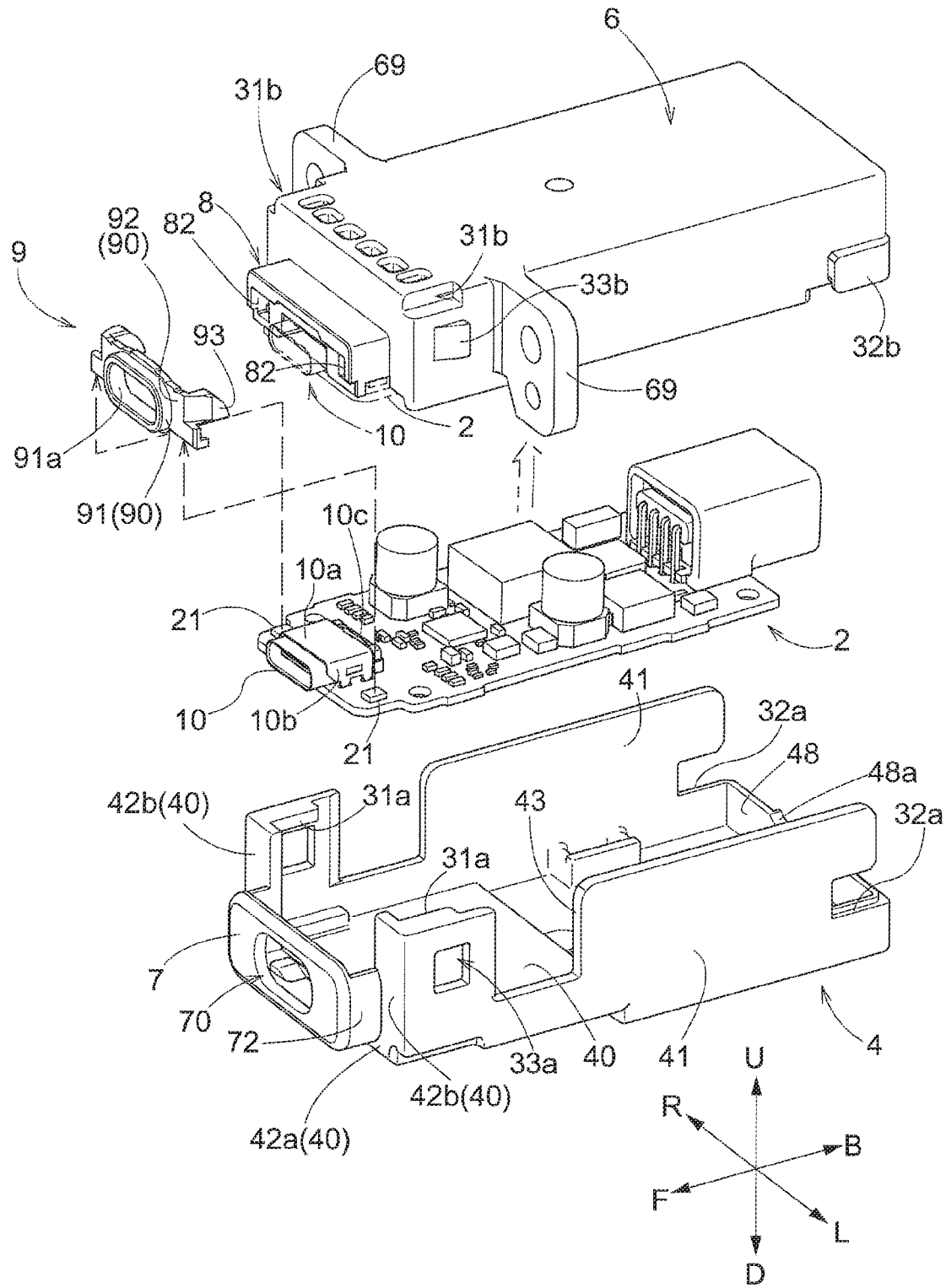
FIG. 3 is an exploded perspective view as seen from above illustrating an assembly method of the connector box relating to the embodiment.

As shown in FIG. 3, the circuit board unit 2 comprises an arrangement of the receptacle connector portion 1, the light emitting portions 21, an input connector 29, other electric devices or elements such as IC's and regulators, being mounted on a circuit board 20 as a printed circuit board. In the order of counter-clockwise from the corner portion on the front side F and also on the right side R of the circuit board 20, there are provided an opening 20a, an opening 20b, an opening 20c, and an opening 20d as through holes.

As shown in FIG. 1, in the circuit board unit 2, the receptacle connector portion 1 is provided at the front end of the circuit board 20. The circuit board 20 comprises a printed circuit board having a longitudinal direction in the front/rear direction. The receptacle connector portion 1 is attached as being slightly advanced from the front end at the end portion on the front side F (this will be referred to as the "front end portion" hereinafter) of the circuit board 20. Namely, the attachment is made with a receptacle connector main body 10 protruding to the front side F from the front end of the circuit board 20.

The receptacle connector portion 1 comprises a connector configured to receive insertion of the plug connector for establishing electric connection therewith. The receptacle connector portion 1 includes a connector insertion opening 11 for receiving insertion of the plug connector in the receptacle connector main body 10. In the receptacle connector portion 1, an end portion (to be referred to as the "rear end portion" hereinafter) on the rear side B of the receptacle connector main body 10 is fixed to the circuit board 20. The receptacle connector portion 1 is fixed to the circuit board 20 with orienting the connector insertion opening 11 toward the front side F.

The receptacle connector main body 10 is a bottomed (i.e. having a bottom) tube having a font end thereof opened to the front side F as the connector insertion opening 11. In the instant embodiment, there is disclosed an example thereof in which a band-like fixing tool fixed to the circuit board 20 is attached to a portion of a bottomed tubular socket portion constituting the receptacle connector main body 10. The receptacle connector main body 10 includes a metal terminal for establishing electric connection between the inside of its bottomed tube and a wiring of the circuit board 20. Further, this metal terminal establishes electric connection with the plug connector inside the bottomed tube. Further, this metal terminal is electrically connected with the wiring of the circuit board 20 and acts, like a kind of fixing tool, to fix the receptacle connector main body 10 to the circuit board 20. The opening of the connector insertion opening 11 is formed like an oval shape whose longitudinal direction extends along the left/right direction. In the instant embodiment, explanation is made with taking, as an example, an arrangement in which the standard of the connector insertion opening 11 is compliance with the USB type C standard of the so-called USB standard.

As shown in FIG. 3, the upper face of the receptacle connector main body 10 constitutes a connector upper wall face 10a which is substantially parallel with the circuit board 20. The left and right side faces of the receptacle connector main body 10 constitute left and right connector side wall faces 10b approximately perpendicular to the circuit board 20 along the front/rear direction. The rear face on the rear side B of the receptacle connector main body 10 constitutes a connector rear end face 10c intersecting the front/rear direction substantially perpendicularly.

The light emitting portions 21 are light source devices for emitting light. In the instant embodiment, there is explained as an example thereof in which light emitting diodes (so-called LED) are employed as the light emitting portions 21. As shown in FIG. 3, the light emitting portions 21 are provided one pair on the left and right outer sides of the receptacle connector main body 10 on the circuit board 20 and spaced apart from each other by a predetermined distance in the left/right direction from the receptacle connector main body 10. The light emitting portions 21 are mounted on the circuit board 20 so as to emit light manly toward the upper side U.

As shown in FIG. 1, the input connector 29 is a connection portion to which a power supply line (not shown) for supplying electric power to the circuit board unit 2 is connected and also to which a signal line (not shown) for transmitting an operational instruction to the circuit board unit 2 is connected. The input connector 29 is attached to the end portion on the rear side B of the circuit board 20, with its connection opening being oriented to the rear side B.

Incidentally, the input connector 29 and the receptacle connector portion 1 are attached to the face (the face on the upper side U in FIG. 1) on the same side of the circuit board 20. In the following discussion, the face on the upper side U of the circuit board unit 2 (the circuit board 20) may sometimes be referred to simply as the "upper face". Further, the face on the lower side D of the circuit board unit 2 (the circuit board 20) may sometimes be referred to simply as the "lower face".

[Casing and Related Components]

Figure 5:
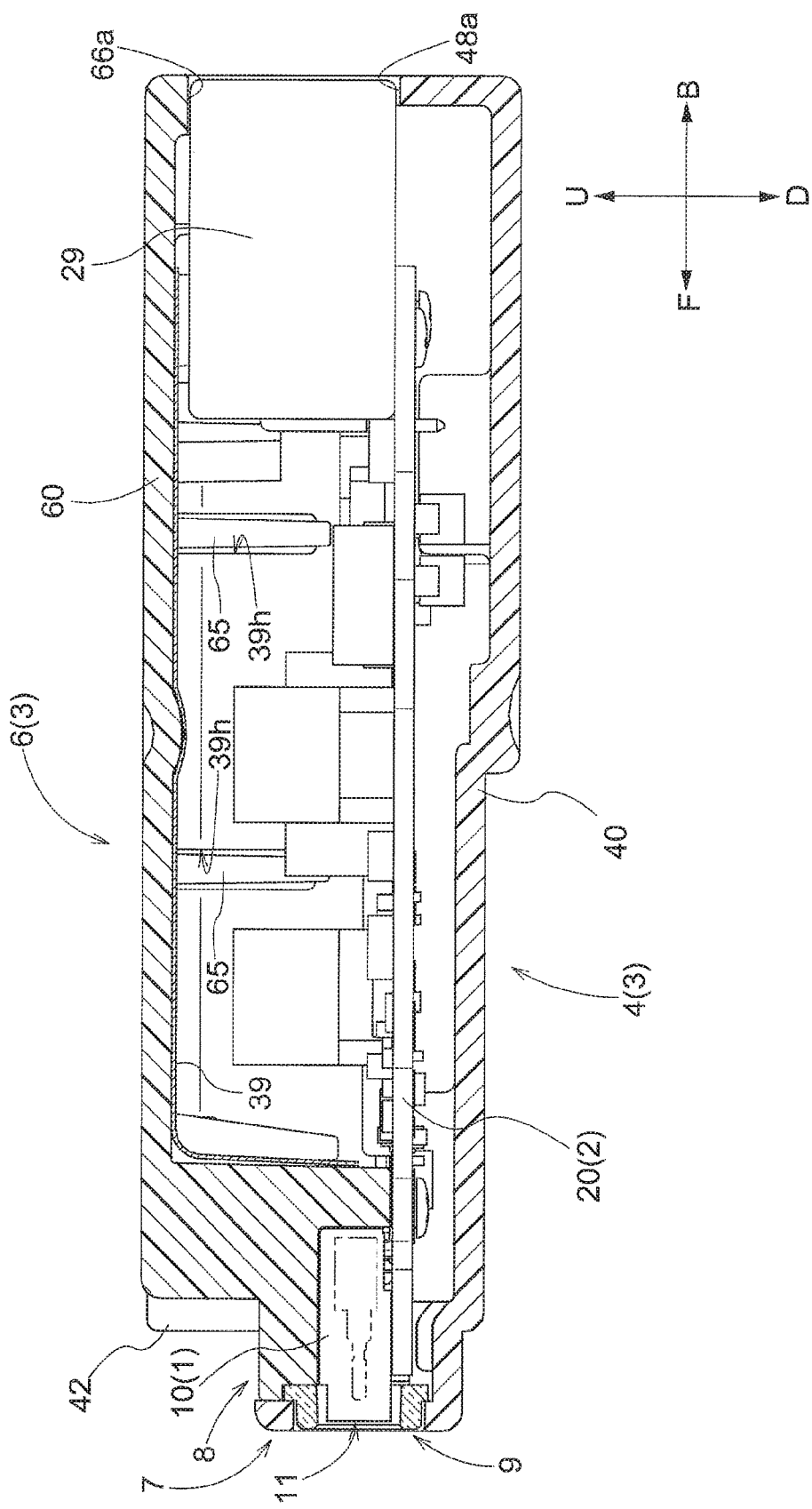
FIG. 5 shows a V-V section of the connector box relating to the embodiment.

As shown in FIG. 1 and FIG. 5, the casing 3 is a container configured to accommodate the circuit board unit 2 with the connector insertion opening 11 of the receptacle connector portion 1 being exposed to the outside. The casing 3 includes the lower casing 4 for covering the lower face of the circuit board unit 2 and the upper casing 6 for covering the upper face of the circuit board unit 2.

As shown in FIG. 3, the circuit board unit 2 is attached to the upper casing 6. When the upper casing 6 with the circuit board unit 2 attached thereto is fitted to the lower casing 4, the upper casing 6 and the lower casing 4 together act as the casing 3 to accommodate the circuit board unit 2 in its inner space (see FIG. 5).

As shown in FIG. 3, the lower casing 4 includes the bottom plate portion 40, the pair of left and right lower side wall portions 41 extending vertically from the bottom plate portion 40 toward the upper side U, lower side front wall portions 42 extending vertically from the bottom plate portion 40 toward the upper side U, the front face plate portion 7 extending to the front side F from the lower side front wall portions 42, a lower side rear wall portion 48 extending vertically from the bottom plate portion 40 to the upper side U, a pair of first engaging portions 31a formed in the lower side wall portions 41 on the side opposite to the bottom plate portion 40, a pair of second engaging portions 32a formed at rear side B end portions of the lower side wall portions 41, and pair of third engaging portions 33a provided one pair adjacent the front side F end portions of the pair of lower side wall portions 41.

As shown in FIG. 1 and FIG. 2, the upper casing 6 includes the top plate portion 60, the pair of left and right upper side wall portions 61 extending vertically from the top plate portion 60 toward the lower side D, an upper side front wall portion 62 extending vertically from the top plate portion 60 toward the lower side D, the receptacle connector accommodating portion 8 formed on the front F side of the top plate portion 60, an upper side rear wall portion 68 extending vertically from the top plate portion 60 toward the lower side D (see FIG. 9), attaching ear portions 69 extending outwards from the outer sides in the left/right direction of the upper side wall 61, the pair of first engaged portions 31b provided at the front side F end portions of two borders between the top plate portion 60 and the pair of left and right upper side wall portions 61, a pair of second engaged portions 32b provided at rear side B end portions of the pair of upper side wall portions 61, and a pair of third engaged portions 33b provided on the outer side faces in the left/right direction in the front side F end vicinity of the upper side wall portions 61.

The lower casing 4 and the upper casing 6 are formed by e.g. injection molding of resin. As examples of resin usable as the lower casing 4 and the upper casing 6, there can be cited polyethylene terephthalate resin, acrylonitrile-butadiene-styrene resin, etc. In the instant embodiment, there is explained a case in which the lower casing 4 and the upper casing 6 are formed by injection molding of polyethylene terephthalate resin.

Referring mainly to FIG. 1 and FIG. 3, mainly the lower casing 4 will be explained. The bottom plate portion 40 is a wall body in the lower casing 4 which covers the lower face of the circuit board unit 2. This bottom plate portion 40 is provided along the circuit board 20 of the circuit board unit 2. The bottom plate portion 40, in the instant embodiment, is a wall body having an approximately rectangular (quadrate) shape whose longitudinal direction extends along the front/rear direction.

The left and right lower side wall portions 41 are wall bodies that extend to the upper side U from the left and right end portions of the bottom plate portion 40. The left and right lower side wall portions 41 cover the circuit board unit 2 from the left and right sides thereof. The left and right lower side wall portions 41 respectively includes the first engaging portions 31a at the upper side U end on the front side F. In the instant embodiment, there is disclosed a case wherein the left and right lower side wall portions 41 further respectively include insertion grooves 43, the second engaging portions 32a and the third engaging portions 33a.

The left and right lower side wall portions 41 respectively includes, at the rear end portion thereof, the second engaging portion 32a. The left and right lower side wall portions 41 respectively includes the insertion groove 43 between the first engaging portion 31a and the second engaging portion 32a. The left and right lower side wall portions 41 respectively includes the third engaging portion 33a on the front side F of the insertion groove 43.

The first engaging portions 31a constitute a mechanism engageable with the first engaged portions 31b for holding (restraining) the upper casing 6 to the lower casing 4 non-detachably in the upper/lower direction. The first engaging portions 31a, in the instant embodiment, are provided as a pair of left and right small wall portions protruding by a small amount from each one of the left and right lower side wall portions 41 toward the other lower side wall portion 41. Specifically, the first engaging portion 31a of the left side L lower side wall portion 41 is a small wall that extends to the right side R from the left side L lower side wall portion 41 and that is parallel with the bottom plate portion 40. The first engaging portion 31a of the right side R lower side wall portion 41 is a small wall that extends to the left side L from the right side R lower side wall portion 41 and that is parallel with the bottom plate portion 40.

The second engaging portions 32a constitute a mechanism engageable with the second engaged portions 32b for holding (restraining) the upper casing 6 to the lower casing 4 non-detachably in the upper/lower direction. The second engaging portions 32a, in the instant embodiment, are provided as slits formed by cutting out the lower side wall portions 41 in the front/rear direction (toward the inner sides of the lower side wall portion 41) from the rear side B end portions of the left and right lower side wall portions 41 toward the front side F. The second engaging portions 32a are provided one left and right pair in the left and right lower side wall portions 41.

The insertion grooves 43 are guide grooves for effecting positioning when the upper casing 6 is to be attached to the lower casing 4 and these are grooves which engage with attaching ear portions 69 of the upper casing 6 when the upper casing 6 has been attached to the lower casing 4. In the instant embodiment, the insertion grooves 43 are provided as groove portions receded to the inner side of the lower side wall portions 41 to the lower side D from the upper side U ends of the left and right lower side wall portions 41. The insertion grooves 43 are provided one left and right pair in the left and right lower side wall portions 41.

The third engaging portions 33a constitute a mechanism engageable with the third engaged portions 33b for holding (restraining) the upper casing 6 to the lower casing 4 non-detachably to the rear side B. The third engaging portions 33a, in the instant embodiment, are provided at positions on the front side F of the insertion grooves 43 and also on the lower side D of the first engaging portions 31*a*. The third engaging portions 33*a* are provided as through holes extending through the lower side wall portions 41 in the left/right direction. The third engaging portions 33*a*, in the instant embodiment, are provided as a pair of through openings provided in the left and right lower side wall portions 41 respectively. Also, in the instant embodiment, each one of the third engaging portions 33*a* is a rectangular opening whose one side extends along the front/rear direction. The third engaging portions 33*a* are provided one left and right pair in the left and right lower side wall portions 41.

Each one of the lower side front wall portions 42 is a wall body that extends to the upper side U from the front side F end portion of the bottom plate portion 40. The lower side front wall portion 42 includes a wall portion 42*a* and a further wall portion 42*b*. The wall portion 42*b* is disposed to extend from the front side F end portion of the respective left and right lower side wall portion 41 toward the respective other left and right lower side wall portion 41. The wall portions 42*b* are provided as one left and right pair of wall bodies. The wall portions 42*a* are wall bodies which are provided between the left and right wall portions 42*b* integrally with these left and right wall portions 42*b* and which extend by a small amount to the upper side U from the front side F ends of the bottom plate portion 40.

The front face plate portion 7 is a portion which forms a using interface of the connector box 100 (a portion that constitutes a so-called aesthetic design). The front face plate portion 7 includes a frame body 72 which extends to the front side F from the lower side front wall portions 42, an interface portion 71 formed at the front end of the frame body 72, and the opening portion 70 provided in the interface portion 71. The frame body 72 is formed like a wall which extends to the front side from the wall portions 42*a* and the wall portions 42*b* to cover the lower side D of the receptacle connector accommodating portion 8 and the left and right opposed side faces of the receptacle connector accommodating portion 8. The interface portion 71 is a wall face provided at the front end of the frame body 72 in parallel with the lower side front wall portions 42. The interface portion 71 is an approximately rectangular-shaped wall face having a longitudinal direction in the left/right direction.

At the approximately center of the interface portion 71, there is provided the opening portion 70 having a longitudinal direction in the left/right direction. This opening portion 70 is provided as a through opening that extends through the interface portion 71 in the front/rear direction. In this opening portion 70, the receptacle connector portion 1 and the light guiding lens 9 fitted on this receptacle connector portion 1 are to be inserted. The relationship among the opening portion 70, the receptacle connector portion 1 and the light guiding lens 9 will be described in greater details later herein.

The lower side rear wall portion 48 is a wall body that extends to the upper side U from the rear side B end portion of the bottom plate portion 40. The lower side rear wall portion 48 includes a receiving portion 48*a* which comes into abutment against and along the lower side D face of the input connector 29 when the upper casing 6 to which the circuit board unit 2 has been attached is fitted to the lower casing 4.

Next, based on FIG. 1 and FIG. 2, mainly the upper casing 6 will be explained. This upper casing 6 is a container within which the shield 39 and the circuit board unit 2 are to be engaged and mounted. The shield 39 and the circuit board unit 2 as being engaged in the upper casing 6 will be attached to the lower casing 4 (see FIG. 3).

The top plate portion 60 is a wall body that covers the upper face (the upper side U face) of the circuit board unit 2 in the upper casing 6. This top plate portion 60 is disposed along the circuit board 20 of the circuit board unit 2. The top plate portion 60, in the instant embodiment, is a wall body having an approximately rectangular shape (quadrate) whose longitudinal direction extends along the front/rear direction.

The top plate portion 60 includes a screw seat 63, a positioning seat 64 and a boss portion 66. The screw seat 63 and the positioning seat 64 are provided at positions overlapped in the upper/lower direction with the opening 20*b* and the opening 20*c* of the circuit board 20. The screw seat 63, the positioning seat 64 and the boss portion 66 extend in the form of bosses to the lower side D from the inner face of the top plate portion 60 (the lower side D face of the top plate portion 60).

The screw seat 63 is disposed adjacent one corner adjacent the rear end of the top plate portion 60 in the inner face of this top plate portion 60. The positioning seat 64 is disposed adjacent the other corner adjacent the rear end of the top plate portion 60 in the inner face of this top plate portion 60.

The screw seat 63 and the positioning seat 64 respectively forms a flat face portion at the lower side D end thereof. These flat face portions of the screw seat 63 and the positioning seat 64 are provided at positions which are distant by an equal height (equal distance) from the inner face of the top plate portion 60. The screw seat 63 defines, at the lower side D end thereof, a screw hole (threaded hole) extending from this end to the upper side U along the upper/lower direction. The positioning seat 64 includes, at the lower side D end thereof, a small protrusion extending from this end to the lower side D along the lower direction.

In the instant embodiment, the boss portions 66 are provided as one left and right pair in the inner face of the top plate portion 60. The boss portions 66 are disposed at the left and right positions adjacent the rear end of the top plate portion 60. The pair of left and right boss portions 66 are disposed more offset to the front side F than the screw seat 63 or the positioning seat 64 in the front/rear direction. The protrusion length of the pair of left and right boss portions 66 from the top plate portion 60 is shorter than the screw seat 63 or the positioning seat 64.

The pair of left and right boss portions 66 respectively includes a face portion facing the rear side B. When the circuit board unit 2 is fitted and attached to the upper casing 6 by engaging thereto, the front end portion of the input connector 29 comes into abutment against this face portion of the boss portion 66.

The left and right upper side wall portions 61 are wall bodies that extend to the lower side D from the left and right end portions of the top plate portion 60. The left and right upper side wall portions 61 cover the circuit board unit 2 from the left and right sides thereof. At the left and right opposed side end portions of the top plate portion 60 which are connected to the upper side U end portions on the front side F of the left and right upper side wall portions 61, the first engaged portions 31*b* are provided.

The left and right upper side wall portions 61 respectively includes the second engaged portion 32*b* at the lower side D end portions on the rear side B. The left and right upper side wall portions 61 respectively includes the attaching ear portion 69 between the first engaged portion 31*b* and the second engaged portion 32*b*. The left and right upper side wall portions 61 respectively includes the third engaged portion 33b on the front side of the attaching ear portion 69.

The first engaged portions 31b constitute a mechanism engageable with the first engaging portions 31a for holding (retaining) the upper casing 6 to the lower casing 4 non-detachably in the upper/lower direction. The first engaged portions 31b are recesses provided at the connecting portion between the top plate portion 60 and the upper side wall portions 61. The first engaged portions 31b, in the instant embodiment, are provided as recesses that extend from the front end of the top plate portion 60 to the rear side B at upper side U end positions of the upper side wall portions 61 to which the top plate portion 60 is connected. In the instant embodiment, the first engaged portions 31b are recesses which are receded to the lower side D in the top plate portion 60. Further, the first engaged portions 31b are recesses which are receded to the inner side of the casing 3 in the left/right direction in the upper side wall portions 61.

In the instant embodiment, as the first engaged portion 31b as a recess slides toward the first engaging portion 31a as a wall portion, the first engaging portion 31a is fitted to the upper side U of the first engaged portion 31b, whereby engagement is established between the first engaging portion 31a and the first engaged portion 31b. More particularly, the upper casing 6 is slid to the front side from the rear side B in the front/rear direction, the wall portion of the first engaging portion 31a will be engaged in/along the recess of the first engaged portion 31b, the upper casing 6 will be fitted between the first engaging portion 31a and the bottom plate portion 40, whereby the upper casing 6 is fixed to the lower casing 4.

The second engaged portions 32b constitute a mechanism engageable with the second engaging portions 32a for holding (restraining) the upper casing 6 to the lower casing 4 non-detachably in the upper/lower direction. The second engaged portions 32b, in the instant embodiment, are provided as protrusions provided along the front/rear direction toward the front side F from the respective ends on the rear side B of the left and right upper side wall portions 61 and protruding to the outer side of the casing 3.

In the instant embodiment, as the second engaged portions 32b as protrusions come into sliding engagement with the second engaging portions 32a as slits, engagement is established between the second engaging portions 32a and the second engaged portions 32b. More specifically, as the upper casing 6 is slid to the front side from the rear side B in the front/rear direction to bring the protruding portions of the second engaging portions 32a along/into fitting with the slits of the second engaged portions 32b, the upper casing 6 is fixed to the lower casing 4.

The attaching ear portions 69 act as guides for positioning when the upper casing 6 is to be attached to the lower casing 4. Further, the attaching ear portion 69 is a flange-shaped fixing seat of the connector box 100 to be fixed by e.g. a screw to an inner wall of a dashboard from its inner side provided at a driver's seat in an automobile for instance.

The attaching ear portions 69, in the instant embodiment, are provided as a pair of wall bodies that extend from the respective wall face of the left and right upper side wall portions 61 toward the outer side of the casing 3 in the left/right direction. Each attaching ear portion 69 includes a through opening 69a extending through in the front/rear direction and a positioning recess 69b in the form of a bottomed tube receded from the front side F face in the front/rear direction. The through opening 69a is a screw insertion hole for fixing a screw when the connector box 100 is to be mounted to e.g. the dashboard via the attaching ear portions 69. The positioning recess 69b is a retaining portion for positioning when the connector box 100 is to be screw-fixed.

The attaching ear portion 69 slides from the upper side U to the lower side D of the lower casing 4 to be fitted in the insertion groove 43 when the upper casing 6 is to be attached to the lower casing 4. Movement of the upper casing 6 relative to the lower casing 4 in the front/rear direction is allowed within the range of the groove width of the insertion groove 43 in the front/rear direction, by means of the attaching ear portion 69 fitted in the insertion groove 43.

The third engaged portions 33b constitute a mechanism engageable with the third engaging portions 33a for holding (restraining) the upper casing 6 to the lower casing 4 non-detachably to the rear side B. The third engaged portions 33b, in the instant embodiment, are provided as protrusions provided in wall face portions on the front side F of the left and right upper side wall portions 61 and at positions on the front side of the attaching ear portions 69 and on the lower side D of the first engaged portions 31b and protruding to the outer sides in the left/right direction from the outer wall faces of the left and right upper side wall portions 61. The third engaged portions 33b extend gently to the outer sides in the left/right direction from the front side F to the rear side B and the end faces on the rear side B are formed in a plane perpendicular to the front/rear direction. In the instant embodiment, the third engaged portions 33b as protrusions come into fitting with the third engaging portions 33a as through openings from the inner side in the left/right direction of the lower casing 4, respectively.

In the inner face of the left and right upper side wall portions 61 respectively, there are provided two ribs 65. The ribs 65 are provided as plate-like portions that extend along the upper/lower direction perpendicularly from the inner face of the upper side wall portion 61. The upper end portions of the ribs 65 are connected to the inner face of the top plate portion 60. The ribs 65 are disposed perpendicularly to the top plate portion 60. The ribs 65 are formed so that the width of the plates progressively increases from the lower side D end to the upper side U end. The heights of the lower side D end portions of the ribs 65 (the distances from the inner face of the top plate portion 60) are shorter than the height of the flat face portions of the screw seat 63 or the positioning seat 64.

The upper side front wall portion 62 is a wall body that extends from the front side F end portion to the lower side D of the top plate portion 60. The upper side front wall portion 62 is connected to the left and right upper side wall portions 61. The lower side D end portion of the upper side front wall portion 62 has a height (distance from the inner face of the top plate portion 60) which is equal to the height of the flat face portion of the screw seat 63 or the positioning seat 64.

The upper side front wall portion 62 includes one pair of right side front end screw seat portion 62a and left side front end screw seat portion 62b and at the lower side D end portion thereof, there is provided a screw hole extending from this end portion to the upper side U along the upper/lower direction. The right side front end screw seat portion 62a and the left side front end screw seat portion 62b are disposed to project slightly to the inner side (rear side B) in the upper side front wall portion 62.

As shown in FIG. 2, the right side front end screw seat portion 62a and the left side front end screw seat portion 62b are provided at positions overlapped vertically respectively with the opening 20a and the opening 20d of the circuit board 20.

The right side front end screw seat portion 62*a* and the left side front end screw seat portion 62*b* are spaced from the left and right upper side wall portions 61 corresponding thereto, so that gaps 62*c* are provided between the right side front end screw seat portion 62*a*, the left side front end screw seat portion 62*b* and the left and right upper side wall portions 61 corresponding respectively thereto.

The upper side rear wall portion 68 (see FIG. 9) is a wall body that extends to the lower side D from the rear side B end portion of the top plate portion 60. The upper side rear wall portion 68 is connected to the left and right upper side wall portions 61. The upper side rear wall portion 68 includes an opening portion 66*a* in which the input connector 29 fits when the circuit board unit 2 is engaged and attached to the upper casing 6. The opening portion 66*a* is provided as a recess which is receded to the upper side U from the lower side D in the upper side rear wall portion 68.

Figure 6:
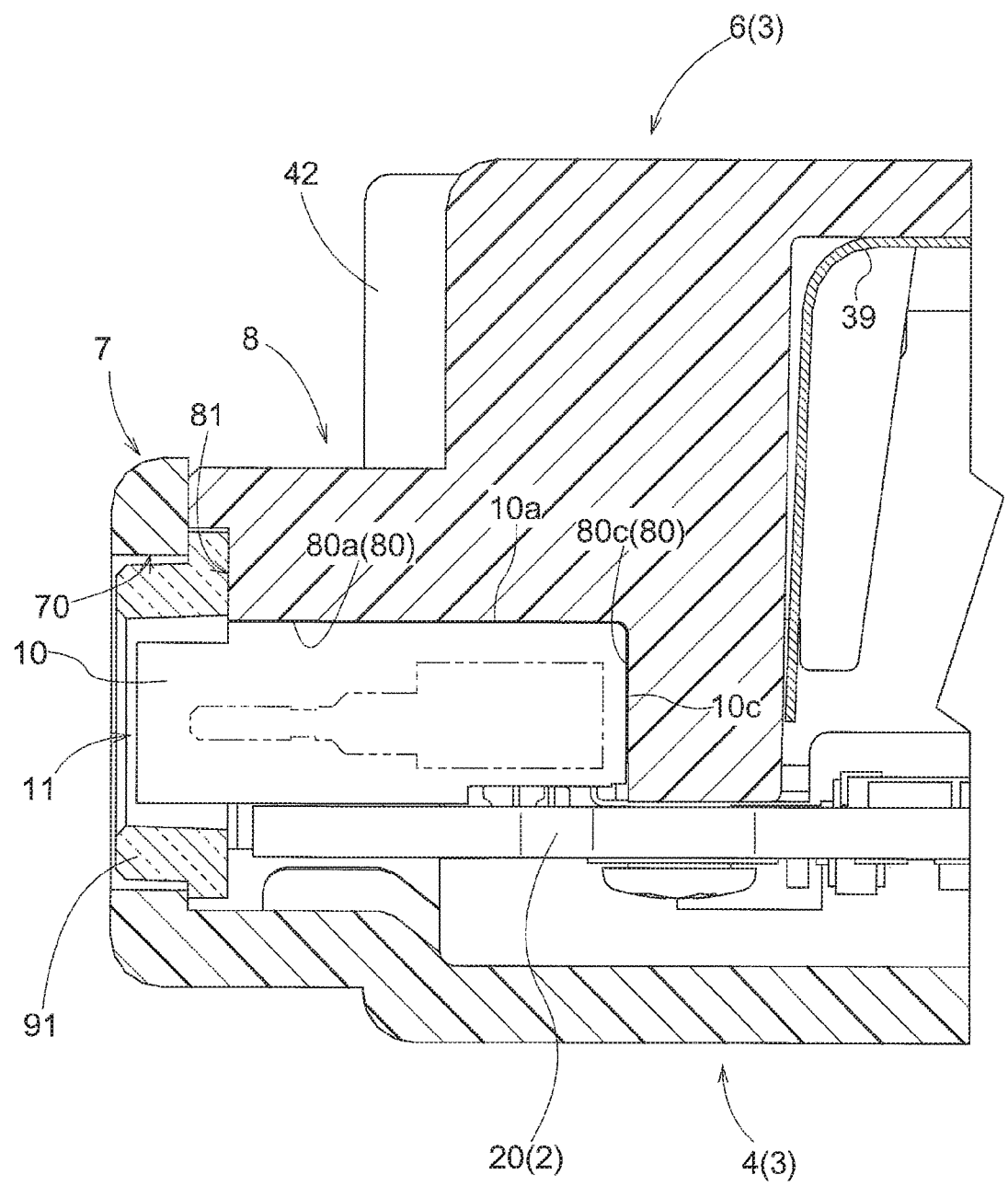
FIG. 6 shows a VI-VI section of a receptacle connector portion and its periphery.

As shown in FIG. 5 and FIG. 6, when the circuit board unit 2 is fitted and attached to the upper casing 6, the input connector 29 is fitted in the opening portion 66*a* with the insertion opening thereof being opened to the outside of the casing 3. The end face on the rear side B of the input connector 29 is formed substantially flush with the end face on the rear side B of the upper side rear wall portion 68.

As shown in FIG. 1, FIG. 2 and FIG. 5, to the inner side of the upper casing 6, the shield 39 is fitted and attached. In the instant embodiment, the shield 39 can be formed integrally by bending work of metal, e.g. a zinc-plated steel plate. As shown in FIG. 1 and FIG. 2, the shield 39 includes a top plate portion which covers the upper face of the circuit board 20 (the upper side U face of the circuit board 20), a front side F wall portion 39*a* that extends from the top plate portion to the lower side D, a right side R wall portion 39*b* and a left side L wall portion 39*c*.

As shown in FIG. 2, in the shield 39, there are provided four slits 39*h* that extend from its top plate portion to the wall portion 39*a* and the wall portion 39*b* in the left/right direction. The slits 39*h* are provided at positions corresponding to the ribs 65 of the upper casing 6 when the shield 39 is fitted to the upper casing 6, so that the ribs 65 may extend through the slits 39*h*, thus fixing the shield 39 in position.

The shield 39 includes two through openings 39*i* in its top plate portion. These through openings 39*i* are provided at positions corresponding to the boss portions 66 of the upper casing 6 when the shield 39 is fitted to the upper casing 6, so that the boss portions 66 may extend through the through openings 39*i*, thus fixing the shield 39 in position.

In the instant embodiment, the front end portions of the wall portion 39*b* and the wall portion 39*c* extend more on the front side F than the wall portion 39*a*, so that when the shield 39 is fitted to the upper casing 6, it is inserted into the gap 62*c*, thus fixing the wall portion 39*b* and the wall portion 39*c* in position inside the upper casing 6.

At the lower side D end of the front end portion of the wall portion 39*b*, there is provided an inspection rib 39*d* formed of a plate face perpendicular to the wall portion 39*b* and parallel with the top plate portion 60. When the shield 39 is fitted to the upper casing 6, the inspection rib 39*d* is vertically overlapped with the screw hole of the right side front end screw seat portion 62*a*.

At the lower side D end of the rear end portion of the wall portion 39*b*, there is provided a screw stopper rib 39*e* formed of a plate face perpendicular to the wall portion 39*b* and parallel with the top plate portion 60 and defining an opening extending therethrough in the upper/lower direction. When the shield 39 is fitted to the upper casing 6, the opening of the screw stopper rib 39*e* is vertically overlapped with the screw hole of the screw seat 63.

At the lower side D end of the front end portion of the wall portion 39*c*, there is provided a screw stopper rib 39*f* formed of a plate face perpendicular to the wall portion 39*c* and parallel with the top plate portion 60 and defining an opening extending therethrough in the upper/lower direction. When the shield 39 is fitted to the upper casing 6, the opening of the screw stopper rib 39*f* is vertically overlapped with the screw hole of the left side front end screw seat portion 62*b*.

At the lower side D end of the rear end portion of the wall portion 39*c*, there is provided a positioning rib 39*g* formed of a plate face perpendicular to the wall portion 39*c* and parallel with the top plate portion 60 and defining an opening extending therethrough in the upper/lower direction. When the shield 39 is fitted to the upper casing 6, the opening of the positioning rib 39*g* is vertically overlapped with the small protrusion of the positioning seat 64. Namely, the small protrusion of the positioning seat 64 is fitted in the opening of the positioning rib 39*g*, thus fixing the shield 39 in position.

As shown in FIG. 2, the receptacle connector accommodating portion 8 is a structure which extends to the front side F from the upper side front wall portion 62. The receptacle connector accommodating portion 8 includes a receptacle connector holding portion 80 and a retaining hole 82 which extends through the front end wall 81 of the receptacle connector accommodating portion 8 in the front/rear direction.

The receptacle connector holding portion 80 is a recess which is receded from the lower side D to the upper side U. The receptacle connector holding portion 80 includes, as wall portions for forming the recess, an upper wall portion 80*a* present on the upper side U, left and right side face portions 80*b*, and a far-side wall portion 80*c* present on the rear side B. The receptacle connector holding portion 80 accommodates at least a portion of the receptacle connector main body 10 inside the space surrounded by the upper wall portion 80*a*, the left and right side face portions 80*b*, and the far-side wall portion 80*c*.

As shown in FIG. 2 and FIG. 6, the upper wall portion 80*a* is provided as a face which is parallel with the circuit board 20 and the connector upper wall face 10*a*. The upper wall portion 80*a* is configured to come into abutment against the connector upper wall face 10*a* when the receptacle connector main body 10 is accommodated in the receptacle connector holding portion 80. Therefore, in case an external force oriented to the upper side U is applied to the receptacle connector main body 10, the connector upper wall face 10*a* can receive this external force. Namely, when such external force oriented to the upper side U is applied to the receptacle connector main body 10, the receptacle connector holding portion 80 receive this external force, so that prying of the receptacle connector main body 10 can be prevented.

Figure 7:
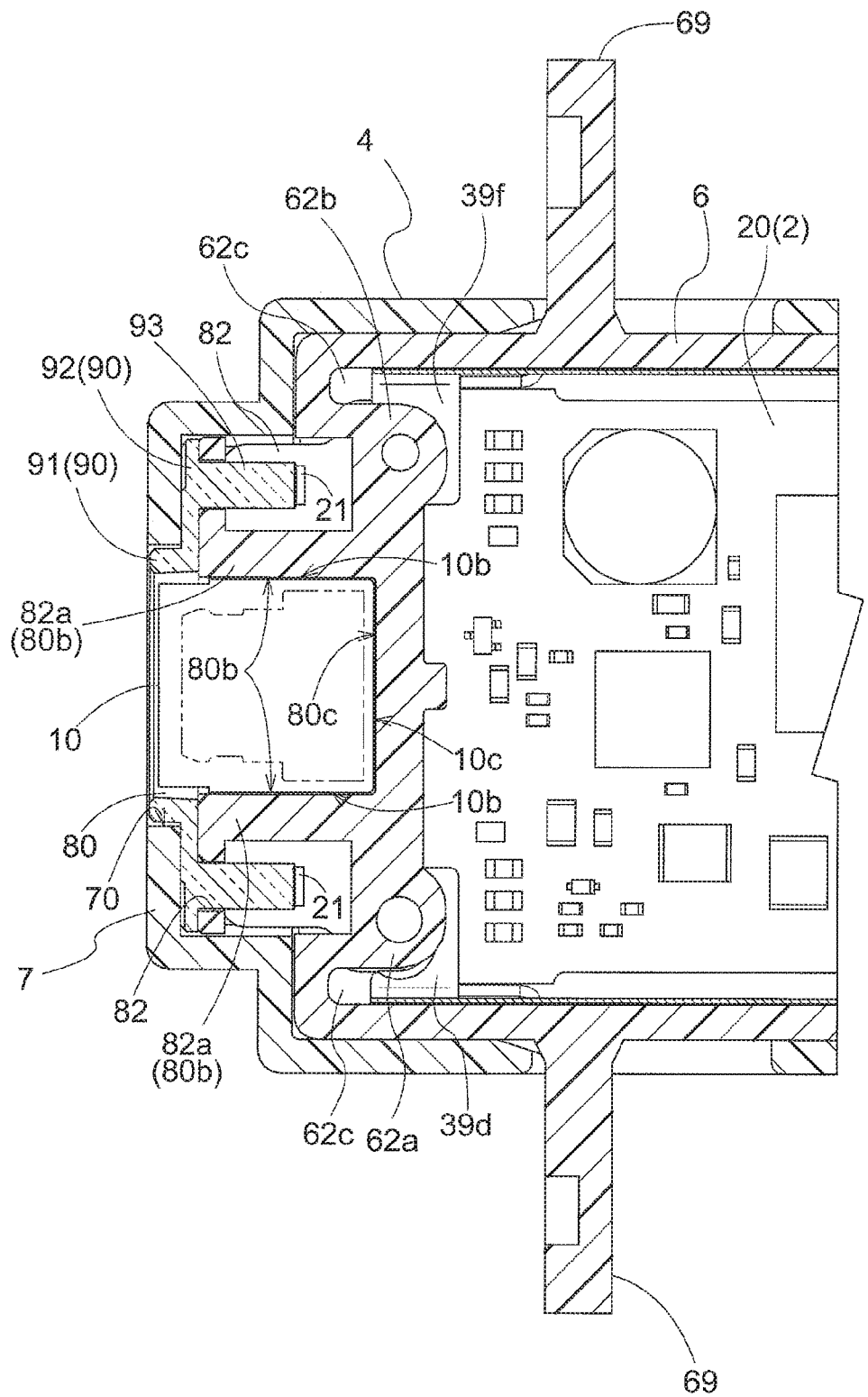
FIG. 7 shows a VII-VII section of the receptacle connector portion and its periphery.

As shown in FIG. 2 and FIG. 7, the left and right side face portions 80*b* are provided as faces along the front/rear direction and perpendicular to the circuit board 20. And, the left and right side face portions 80*b* are provided as faces perpendicular to the connector side wall face 10*b*. The side face portions 80*b* are configured to come into abutment against the left and right connector side wall faces 10*b* respectively when the receptacle connector main body 10 is accommodated in the receptacle connector holding portion 80. Therefore, when an external force is applied to the left side L or the right side R to the receptacle connector main body 10, this external force can be received by the left and right side face portions 80*b*. Namely, in the event of application of an external force to the left side L or the right side R, this external force can be received, so that prying of the receptacle connector main body 10 can be prevented.

The far-side wall portion 80c is provided as a face perpendicular to the front/rear direction. Also, this far-side wall portion 80c is a face parallel with the connector rear end face 10c. The far-side wall portion 80c is configured to come into abutment against the connector rear end face 10c when the receptacle connector main body 10 is accommodated in the receptacle connector holding portion 80. Therefore, when an external force is applied to the rear side B to the receptacle connector main body 10, this external force can be received by the far-side wall portion 80c. Namely, in the event of application of an external force to the rear side B to the receptacle connector main body 10, generation of a bending stress to the metal terminal of the receptacle connector portion 1 connected to the circuit board 20 is prevented.

The retaining holes 82 are provided one pair on the left and right outer sides of the receptacle connector holding portion 80 in the receptacle connector accommodating portion 8. The retaining holes 82 extend through the front end wall 81 of the receptacle connector accommodating portion 8 in the front/rear direction and are opened to the lower side within the receptacle connector accommodating portion 8, thus being provided as through openings in opposition to the light emitting portions 21. In other words, the retaining holes 82 provide space which is present inside the receptacle connector accommodating portion 8 and located at positions overlapped with the left and right respective light emitting portions 21 (in opposition to the light emitting portions 21) in the upper/lower direction and opened in the front end wall 81. Therefore, the retaining holes 82 are communicated to the light emitting portions 21. Also, the retaining holes 82 are in opposition to the light emitting portions 21. The retaining holes 82 constitute also attaching portions to which the light guiding lens 9 is to be attached, as will be described later.

As shown in FIG. 7, between the pair of retaining holes 82 and the left and right opposed sides of the receptacle connector holding portion 80, a pair of wall portions 82a are provided. Namely, in the left/right direction, the wall portions 82a are disposed to be overlapped with from the receptacle connector holding portion 80, the wall portions 82a and the retaining holes 82 in this order.

Namely, the wall portions 82a are disposed between the light emitting portions 21 and the receptacle connector main body 10 held in the receptacle connector holding portion 80. Thus, light emitted by the light emitting portions 21 will not leak to the receptacle connector main body 10. Namely, it is possible to reduce light leakage through the connector insertion opening 11 of the receptacle connector main body 10. For, the light emitted by the light emitting portions 21 will be shielded by the wall portions 82a and the circuit board 20 and will not be guided (irradiated) to the receptacle connector main body 10. Thus, the aesthetics of the connector box 100 is improved. Further, since it is possible to illuminate only the circumference of the connector insertion opening 11 by the light guiding lens 9, the visibility for a user can be improved. Incidentally, in the instant embodiment, the wall portions 82a are portions of the left and right side face portions 80b.

[Light Guiding Lens]

The light guiding lens 9 is an optical lens configured to guide light emitted by the light emitting portions 21 to the outside of the casing 3. As shown in FIG. 2 and FIG. 3, the light guiding lens 9 includes the annular portion 90 fitted to the outer side of the receptacle connector main body 10 (fitted on the receptacle connector main body 10) in the outer circumference direction and the retaining portions 93 extending from the annular portion 90 to the rear side B.

In the instant embodiment, the annular portion 90 includes an annular lens portion 91 fitted to the outer side of the receptacle connector main body 10 in the outer circumferential direction and a light guiding edge portion 92 extending to the outer side in the circumferential direction from the annular lens portion 91. And, the retaining portions 93 extend to the rear side B from the light guiding edge portion 92 as the annular portion 90.

The light guiding lens 9 is formed of a material capable of light transmission. As examples of such material capable of light transmission, transparent resin and glass can be cited. The light guiding lens 9, in the instant embodiment, is formed by injection molding of a transparent resin with the annular lens portion 91, the light guiding edge portion 92 and the retaining portions 93 being integral with each other. As examples of such transparent resin capable of forming the light guiding lens 9 in this instant embodiment, acrylic resin and polycarbonate can be cited. In the instant embodiment, there is explained an example in which the light guiding lens 9 is integrally formed by injection molding of acrylic resin.

The annular lens portion 91 has an opening 91a which is to be fitted to the receptacle connector main body 10 from the outer side. The annular lens portion 91 is a tube extending in the front/rear direction and its cross section is formed oval approximately. The opening 91a is a through hole extending through in the front/rear direction. The opening 91a is provided in a form along the outer contour of the receptacle connector main body 10. The light guiding lens 9 will be mounted by inserting the annular lens portion 91 into the opening 70 with the receptacle connector main body 10 being inserted in the opening 91a, i.e. with the annular lens portion 91 being fitted on the receptacle connector main body 10.

As shown in FIG. 8, under the state of the light guiding lens 9 being attached to the casing 3, i.e. with the annular lens portion 91 being inserted in the opening 70, the annular lens portion 91 is spaced from the receptacle connector main body 10 and from the outer circumference of this receptacle connector main body 10 in its entire circumference. That is, between the inner side of the annular lens portion 91 and the receptacle connector main body 10, a gap 12 of the annular lens portion 91 is provided. Therefore, even if the receptacle connector main body 10 is deformed due to application of an external force to this receptacle connector main body 10, such deformation strain can be absorbed (namely, its transmission is prevented) by the gap 12 between the annular lens portion 91 and the receptacle connector main body 10. Thus, an external force applied to the receptacle connector main body 10 will not provide any stress (strain stress) to the annular lens portion 91.

Under the state of the light guiding lens 9 being attached to the casing 3, i.e. with the annular lens portion 91 being inserted in the opening 70, the annular lens portion 91 is spaced from the opening 70 along the entire inner circumference thereof. In other words, the opening 70 is spaced from the outer circumference of the annular lens portion 91 in its entire circumference. Namely, between the opening 70 and the outer side of the annular lens portion 91, there is provided a gap 13 that extends along the entire circumference of the outer side of the annular lens portion 91. Therefore, when an external force is applied to the receptacle connector main body 10, this external force will not be transmitted to the opening 70, due to the gap 13 between the opening 70 and the outer side of the annular lens portion 91. Thus, an external force applied to the receptacle connector main body 10 will not provide any stress (strain stress) to the annular lens portion 91.

As shown in FIG. 2 and FIG. 3, the light guiding edge portion 92 is a plate-like portion that extends from the rear side B end portion of the annular lens portion 91 to the outer circumference side of the annular lens portion 91. The light guiding edge portion 92 extends mainly to the outer side in the left/right direction from the rear side B end portion of the annular lens portion 91.

As shown in FIG. 6, when the light guiding lens 9 is attached to the casing 3, the light guiding edge portion 92 is fixed as being clamped between the rear face of the front face plate portion 7 and the front end wall 81 of the receptacle connector accommodating portion 8. Namely, the light guiding lens 9 is fixed by being clamped between the rear face of the front face plate portion 7 and the front end wall 81 of the receptacle connector accommodating portion 8. Therefore, the light guiding lens 9 will be mounted under a floating state that allows shifting (free movement) thereof in the upper/lower direction and left/right direction, between the front end wall 81 and the rear face of the front face plate portion 7.

As shown in FIG. 2, FIG. 3 and FIG. 7, the retaining portions 93 constitute a retaining member for retaining the light guiding lens 9 to the upper casing 6 and also a light guiding portion for guiding light emitted by the light emitting portions 21 (see FIG. 7) to the light guiding lens 9 (annular lens portion 91). The retaining portions 93 are formed to extend toward the rear side B along the front/rear direction from the light guiding edge portion 92. The retaining portions 93 are provided one pair on the left and right outer sides of the annular lens portion 91 in correspondence with the pair of retaining holes 82.

As shown in FIG. 7, the retaining portion 93 is retained to the upper casing 6 as being inserted into the retaining hole 82 that extends through the front end wall 81 of the receptacle connector accommodating portion 8 in the front/rear direction. Thus, the retaining portion 93 provides optical coupling of the insertion opening of the retaining hole 82 in the front/rear direction. Namely, with the insertion of the retaining portion 93 to the retaining hole 82, light guiding in the front/rear direction of the insertion opening of the retaining hole 82 is enabled. The retaining portions 93, when inserted to the retaining holes 82, are overlapped, at least portions thereof, with the light emitting portions 21 in the upper/lower direction. The retaining portions 93 are disposed on more upper side U (that is, the direction of light emissions by the light emitting portions 21) than the light emitting portions 21 in the upper/lower direction.

Next, light guiding by the light guiding lens 9 will be explained. When the light emitting portion 21 emits light, this light enters the retaining portion 93. This light incident from the retaining portion 93 will be reflected in repetition within the light guiding lens 9 and transmitted from the retaining portion 93 to the light guiding edge portion 92 and further transmitted from the light guiding edge portion 92 to the annular lens portion 91. Then, the light guided to the annular lens portion 91 will be irradiated to the outside of the casing 3. As the annular lens portion 91 is illuminated, when the car cabin is dim, e.g. even in nighttime, a passenger can accurately visually recognize the position of the connector insertion opening 11 (the visibility of the connector insertion opening 11 is enhanced). Therefore, the passenger can correctly insert the plug connector into the connector insertion opening 11.

[Explanation of Assembly Method]

Firstly, an assembly method of the connector box 100 will be explained. First, the shield 39 will be engaged and attached to the upper casing 6 (see FIG. 2).

Next, the circuit board unit 2 will be fitted and attached to the upper casing 6 to which the shield 39 has been attached (see FIG. 2 and FIG. 3). In this, the receptacle connector main body 10 of the receptacle connector portion 1 will be fitted to the receptacle connector holding portion 80 of the receptacle connector accommodating portion 8 (see FIG. 3, FIG. 6 and FIG. 7).

When the circuit board unit 2 is further fitted and attached to the upper casing 6 to which the shield 39 has been attached, the opening 20a, the opening 20b, the opening 20c and the opening 20d of the circuit board 20 in this mentioned order will be overlapped vertically with the inspection rib 39d, the screw stopper rib 39e and the positioning rib 39g of the shield 39, respectively. In the course of this, the opening 20c will be fitted with the small protrusion of the positioning seat 64, thus fixing the circuit board unit 2 in position. The circuit board unit 2 is fixed with screws 25 to the left side front end screw seat portion 62b and the screw seat 63 (see FIG. 2).

Incidentally, if the circuit board unit 2 is fitted and attached to the upper casing 6 after fitting the shield 39 to the upper casing 6, the inspection rib 39d can be visually recognized from the lower side D of the opening portion of the opening 20c. However, if the circuit board unit 2 is fitted and attached to the upper casing 6 without fitting the shield 39 to the upper casing 6, the inspection rib 39d cannot be visually recognized from the lower side D of the opening portion of the opening 20c. In this way, the inspection rib 39d is utilized for checking whether the shield 39 has been attached to the upper casing 6 or not.

Next, the light guiding lens 9 will be attached to the receptacle connector accommodating portion 8 of the upper casing 6. This attachment of the light guiding lens 9 is carried out as follows. The following explanation will be made with reference to FIG. 3. First, the light guiding lens 9 will be slid to the rear side B in the front/rear direction and the retaining portions 93 will be inserted and fitted to the retaining holes 82. In this, the opening 91a of the annular lens portion 91 will be fitted to the outer side of the receptacle connector main body 10. Namely, the annular lens portion 91 will be fitted on the receptacle connector main body 10. The light guiding lens 9 will slide to the rear side B until the light guiding edge portion 92 comes into abutment against the front end wall 81. Upon abutment of the light guiding edge portion 92 against the front end wall 81, the attachment of the light guiding lens 9 to the upper casing 6 is completed.

Next, the upper casing 6 will be fitted and attached to the lower casing 4. In this, as described hereinbefore, the upper casing 6 has already been attached with the circuit board unit 2 and the light guiding lens 9. In the following discussion, unless indicated otherwise, it is assumed that the upper casing 6 has already been attached with the circuit board unit 2 and the light guiding lens 9.

Next, explanation will be made with reference to FIG. 3. When the upper casing 6 is to be fitted to the lower casing 4, firstly, the attaching ear portions 69 together with the third engaged portions 33b of the upper casing 6 will be fitted in the insertion grooves 43 of the lower casing 4. When the attaching ear portions 69 are fitted in the insertion grooves 43, the attaching ear portions 69 will be brought into abutment against the lower side D edges of the insertion grooves 43.

Then, the upper casing 6 and the circuit board unit 2 together will be slid to the front side F in the front/rear direction, whereby the upper casing 6 will be fitted in the space surrounded by the first engaging portions 31a, the left and right lower side wall portions 41 and the bottom plate portion 40.

In the course of the above, the wall portions of the first engaging portions 31a will be fitted and engaged in the grooves of the first engaged portions 31b. With this engagement, the upper casing 6 will be restrained in the upper/lower direction of the circuit board 20 relative to the lower casing 4.

Further, in the course of the above, the protruding portions of the second engaged portions 32b will be engaged in the slits of the second engaging portions 32a. With this engagement, the upper casing 6 will be restrained in the upper/lower direction of the circuit board 20 relative to the lower casing 4.

Still further, in the course of the above, the protrusions of the third engaged portions 33b will be engaged in the through openings of the third engaging portions 33a. With this engagement, movement of the upper casing 6 to the rear side B in the front/rear direction of the circuit board 20 relative to the lower casing 4 is restricted. Incidentally, in the upper casing 6, the upper side front wall portion 62 of the upper casing 6 comes into abutment against the rear side B face of the lower side front wall portion 42 of the lower casing 4, movement to the front side F in the front/rear direction of the circuit board 20 is restrained.

Figure 4:
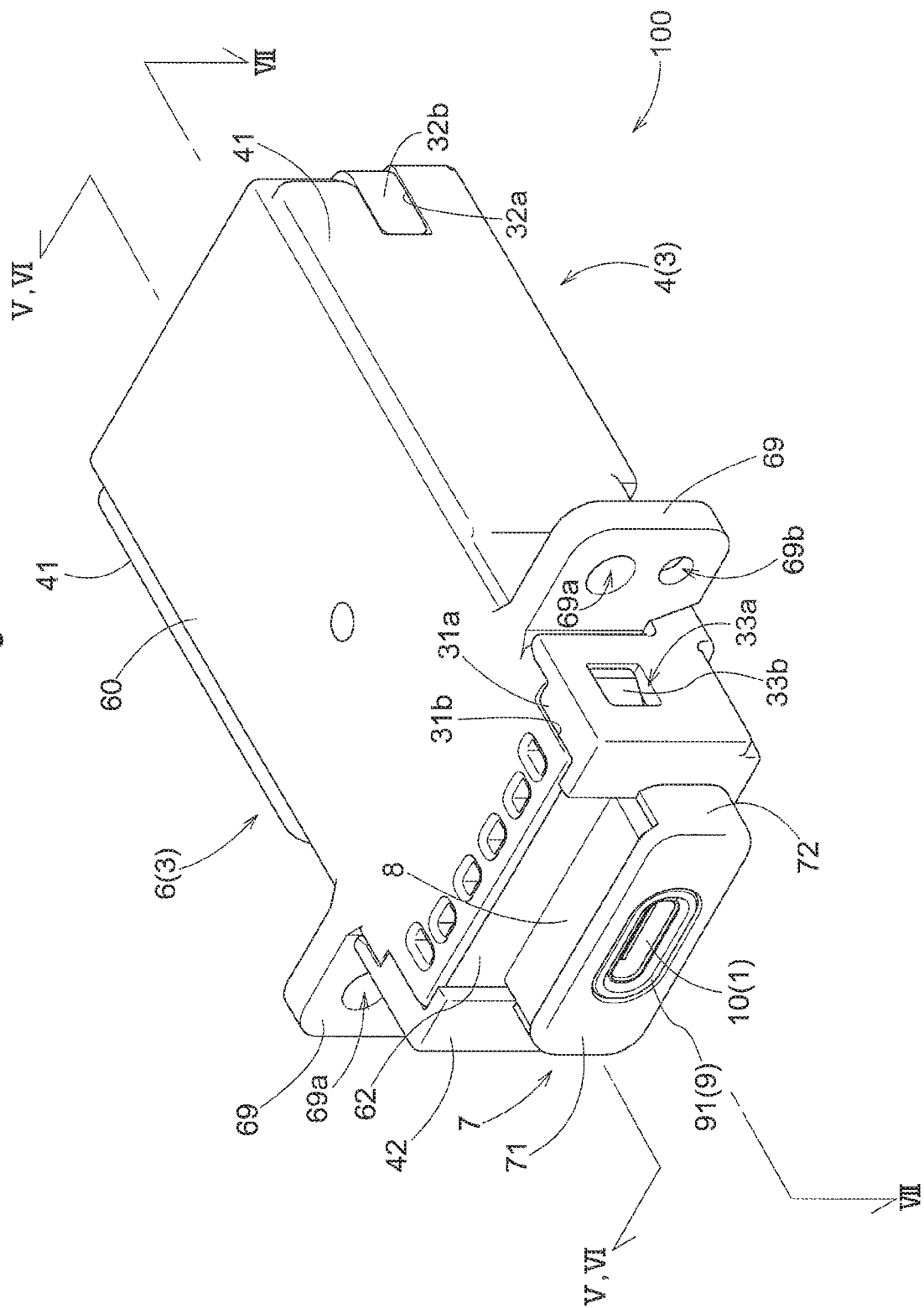
FIG. 4 is a perspective view as seen from above of the connector box relating to the embodiment.

Further, when the upper casing 6 and the circuit board unit 2 together are slid to the front side F in the front/rear direction to fit the upper casing 6 between the first engaging portions 31a and the bottom plate portion 40, the receptacle connector main body 10 and the annular lens portion 91 together will be inserted to and fitted in the opening 70 of the front face plate portion 7. With the above process, the assembly of the connector box 100 is completed. The connector box 100 after completion of its assembly is shown in FIG. 4.

In this way, with the assembly by sliding the upper casing 6 in the front/rear direction perpendicular to the circuit board 20, the upper casing 6 will be engaged with the lower casing 4 and the upper casing 6 will be held (restrained) non-detachably in the upper/lower direction relative to the lower casing 4.

The connector box 100 after completion of the assembly will be attached, for its use, to e.g. a dashboard of a cabin of a car as one example of a wall to which the connector box 100 is to be attached (attaching target wall). Next, as an example of use of the connector box 100, additional explanation will be given by way of an exemplary case wherein the connector box 100 is to be attached to a dashboard.

[Explanation of Exemplary Use of Connector Box]

When the connector box 100 is to be attached to the dashboard, the attaching ear portions 69 will be disposed on the rear face side of the dashboard and the interface portion 71 of the front face plate portion 7 will be exposed on the side of car cabin. Fixing of the connector box 100 to the dashboard can be made by screw fixing to the rear face of the dashboard. In the instant embodiment, by inserting and fixing screws to through openings 69a of the attaching ear portions 69 to fix these attaching ear portions 69 to the rear face side of the dashboard, the connector box 100 can be fixedly supported to the dashboard.

Incidentally, as the attaching ear portions 69 are included in the upper casing 6 and via these attaching ear portions 69, the connector box 100 is fixedly supported to the dashboard, an external force applied to the receptacle connector portion 1 can be received by the attaching ear portions 69 of the upper casing 6. Therefore, the connector box 100 as a whole can be made more resistant against damage; thus, the durability of the connector box 100 can be enhanced.

Under the above-described state, the passenger (user) can visually recognize the connector insertion opening 11 from the car cabin side. Moreover, the user can also insert/withdraw the plug connector to/from the connector insertion opening 11 from the car cabin side. The input connector 29 will be connected to an electric circuit on the car cabin side. Controls of e.g. electric power supply to the connector box 100 and light emission ON/OFF of the light emitting portions 21 will be made by e.g. an engine control unit (so called ECU, this will be referred to as ECU hereinafter) of the car.

For instance, when a user starts the car, the ECU will cause the light emitting portions 21 of the connector box 100 to emit light under a predetermined condition. Incidentally, as some examples of such "predetermined condition", there can be cited a case when the ECU recognizes dimness of the car cabin or a case when the passenger instructs the ECU for illumination of the light emitting portions 21. When the light emitting portion 21 is illuminated, the light of the light emitting portion 21 will be guided to the annular lens portion 91 of the light guiding lens 9. Namely, with light emission from the light emitting portion 21, the annular lens portion 91 will be lit. By visually recognizing the illuminated annular lens portion 91, the user can recognize the position of the connector insertion opening 11 with good visibility in a dim car cabin, e.g. in nighttime. Therefore, when the user is to insert/withdraw the plug connector into/from the connector insertion opening 11, the user can insert/withdraw the plug connector correctly with an appropriate orientation. Thus, it is possible to reduce the risk of an external force being applied from the plug connector to the receptacle connector portion 1 in a direction offset from the insertion/withdrawal direction of the plug connector, that is, offset from the font/rear direction (force in the prying direction). Consequently, it is possible to reduce the risk of trouble occurrence such as inadvertent detachment of the receptacle connector portion 1 from the circuit board 20.

Under the state of the plug connector being inserted to the connector insertion opening 11, even if an external force is applied to the plug connector in the upper/lower direction, the upper casing 6 will not be readily detached from the lower casing 4. For, e.g. even if such external force is transmitted to the circuit board 20 via the receptacle connector portion 1 and the circuit board 20 then transmits this external force in the upper/lower direction to the upper casing 6 or the lower casing 4, this external force in the upper/lower direction is received by the engagement between the first engaging portions 31a and the first engaged portions 31b. Further, in addition to the above, such external force in the upper/lower direction is received also by the engagement between the second engaged portions 32b and the second engaging portions 32a.

When the plug connector is to be inserted into the connector insertion opening 11 or when the plug connector has been inserted therein, even if an external force is applied to this plug connector, the receptacle connector portion 1 will not be detached from the circuit board 20. For, as the connector upper wall face 10a, the connector side wall faces 10b and the connector rear end face 10c as the outer faces of the receptacle connector portion 1 are placed in abutment against the upper wall portion 80*a*, the side face portions 80*b* and the far-side wall portion 80*c*, such external force applied from the plug connector to the receptacle connector portion 1 will be received by the receptacle connector accommodating portion 8 of the upper casing 6, thus preventing prying distortion of the receptacle connector portion 1. Consequently, it is possible to reduce the risk of trouble occurrence such as inadvertent detachment of the receptacle connector portion 1 from the circuit board 20.

Even if an external force in the left/right direction is applied from the plug connector to the receptacle connector portion 1, since the left and right side face portions 80*b* of the receptacle connector holding portion 80 of the receptacle connector accommodating portion 8 are placed in abutment against the receptacle connector main body 10, the receptacle connector accommodating portion 8 (side face portions 80*b*) will support the receptacle connector portion 1 against such external force.

Similarly, even if an external force directed to the upper side U is applied from the plug connector to the receptacle connector portion 1, since the upper wall portion 80*a* of the receptacle connector holding portion 80 is placed inn abutment against the receptacle connector main body 10, the receptacle connector accommodating portion 8 (upper wall portion 80*a*) will support the receptacle connector portion 1 against such external force.

Further similarly, even if an external force directed to the rear side B is applied from the plug connector to the receptacle connector portion 1, since the far-side wall portion 80*c* of the receptacle connector holding portion 80 is placed in abutment against the receptacle connector main body 10, the receptacle connector accommodating portion 8 (far-side wall portion 80*c*) will support the receptacle connector portion 1 against such external force.

When the plug connector is to be inserted into the connector insertion opening 11 or when the plug connector has been inserted therein, even if an external application is applied from this plug connector to the receptacle connector main body 10, such external force will not be applied to the light guiding lens 9. For, the gap 12 present between the receptacle connector main body 10 and the light guiding lens 9 will prevent transmission of such external force. Especially, in the case of application of an external force to the receptacle connector main body 10 in the front/rear direction, the retaining portions 93 can "ward off" such external force in the front/rear direction along the retaining holes 82, because these retaining holes 82 into which the retaining portions 93 are inserted extend through along the front/rear direction. Moreover, since the light guiding lens 9 is mounted under the floating state described above, even if a force perpendicular to the front/rear direction is applied via the receptacle connector main body 10 to the upper casing 6, such perpendicular force can be warded off as the light guiding lens 9 is shifted in the front/rear direction. Therefore, transmission of an external force to the light guiding lens 9 is prevented, so that it is possible to reduce the risk of trouble occurrence such as breakage of the light guiding lens 9.

Under the state of the plug connector being inserted in the connector insertion opening 11, even if an external force is applied from this plug connector to the receptacle connector main body 10, no external force will be applied to the front face plate portion 7 (interface portion 71), because transmission of such external force is prevented by the gap 12 and the gap 13 between the receptacle connector main body 10 and the opening portion 70 of the front face plate portion 7.

For instance, even if such external force is transmitted to the circuit board 20 via the receptacle connector portion 1 and this circuit board 20 further transmits this force to the upper casing 6, such external force will be absorbed in the dashboard as the attaching target via the attaching ear portions 69.

As described above, the present disclosure can provide a connector box having higher prying load resistance and an assembly method thereof.

[Other Embodiments]

(1) In the foregoing embodiment, there was disclosed a case in which the second engaging portions 32*a* come into engagement with the second engaged portions 32*b*, thus holding the upper casing 6 to the lower casing 4 non-detachably in the upper/lower direction. However, it is also possible to employ an arrangement omitting the second engaging portions 32*a* and the second engaged portions 32*b*.

(2) In the foregoing embodiment, there was disclosed a case in which the third engaged portions 33*b* come into engagement with the third engaging portions 33*a*, thus holding the upper casing 6 to the lower casing 4 non-detachably to the rear side B. However, it is also possible to employ an arrangement omitting the third engaging portions 33*a* and the third engaged portions 33*b*.

(3) In the foregoing embodiment, there was disclosed a case in which the first engaging portions 31*a* and the first engaged portions 31*b*, the second engaging portions 32*a* and the second engaged portions 32*b*, the third engaged portions 33*b* and the third engaging portions 33*a*, are provided respectively. However, it is also possible to arrange for the first engaging portions 31*a* and the first engaged portions 31*b*, or the second engaging portions 32*a* and the second engaged portions 32*b*, to act also as the third engaged portions 33*b* and the third engaging portions 33*a*. For instance, the second engaging portions 32*a* and the second engaged portions 32*b* can constitute e.g. a snap-fit mechanism wherein the second engaging portions 32*a* and the second engaged portions 32*b* restrain each other in the front/rear direction also, in addition to the above-described arrangement.

(4) In the foregoing embodiment, there was disclosed a case in which the receptacle connector holding portion 80 includes the upper wall portion 80*a*, the left and right side face portions 80*b* and the far-side wall portion 80*c*. However, in case the direction of an external force applied to the receptacle connector portion 1 is limited, it is possible to arrange the receptacle connector holding portion 80 such that prying distortion may be prevented at least in the direction of application of external force to the upper wall portion 80*a* or the left side face portion 80*b* or the right side face portion 80*b* or the far-side wall portion 80*c*.

(5) In the foregoing embodiment, there was disclosed a case in which the light guiding lens 9 includes the annular portion 90 that fits to the outer side in the outer circumferential direction of the receptacle connector main body 10 and the retaining portions 93 extending to the rear side B from the annular portion 90 and this annular portion 90 includes the annular lens portion 91 that fits to the outer side in the outer circumferential direction of the receptacle connector main body 10 and the light guiding edge portion 92 extending to the outer side in the circumferential direction from the annular lens portion 91. Alternatively, the light guiding lens 9 can include the annular lens portion 91 and the retaining portions 93 extending to the rear side B from the annular lens portion 91.

(6) In the foregoing embodiment, there was disclosed a case in which the retaining portions 93 are provided one pair on the left and right outer sides of the annular lens portion 91 in correspondence with the pair of retaining holes 82. Alternatively, such retaining portion 93 and the retaining hole 82 can be provided one for each.

(7) In the foregoing embodiment, there was disclosed a case in which the light emitting portions 21 are provided one pair on the left and right outer sides of the receptacle connector main body 10 on the circuit board 20 and spaced by a predetermined distance from the entire outer circumference of the receptacle connector main body 10.

(8) In the foregoing embodiment, there was disclosed a case in which the annular lens portion 91 of the light guiding lens 9 is spaced apart from the entire outer circumference of the receptacle connector main body 10. Alternatively, the annular lens portion 91 and the outer circumference of the receptacle connector main body 10 may be in abutment against each other for a portion of circumference or entire circumference. In this case, the strength of the receptacle connector main body 10 is increased, so that deformation of the receptacle connector main body 10 due to an external force can be prevented or suppressed even in the event of application of external force to the receptacle connector main body 10.

Incidentally, the arrangement(s) disclosed in the foregoing embodiments (including the further embodiments) can be used in any combination with the arrangement(s) disclosed in other embodiments, unless contradiction occurs. Further, the embodiments disclosed in the above description are only exemplary. The present disclosure is not limited thereto, but may be modified as needed or desired within a range not departing from the essence of the present disclosure.

The invention claimed is:

1. A connector box comprising:
   a receptacle connector portion having a connector insertion opening into which a plug connector is inserted from a front side;
   a circuit board unit having the receptacle connector portion at a front end of a circuit board;
   a casing configured to accommodate the circuit board unit with the connector insertion opening being opened to an outside;
   a light guiding lens for guiding light to the outside of the casing;
   the light guiding lens including an annular portion fitted to an outer side of the receptacle connector portion and a pair of retaining portions extending rearwards from the annular portion;
   the circuit board unit including a light emitting portion disposed in an upper face portion of the circuit board and optically coupled with at least one of the pair of retaining portions;
   the casing including a lower casing for covering a lower face of the circuit board unit and an upper casing for covering an upper face of the circuit board unit and engaged with the lower casing, the circuit board unit being fixed to the upper casing;
   the upper casing having a front end wall and a retaining hole extending through the front end wall in a front/rear direction; and
   the light guiding lens being mounted to the upper casing with the retaining portions thereof being inserted in the retaining hole.

2. The connector box of claim 1, wherein:
   the light emitting portion is provided on at least one of left and right outer sides of the receptacle connector portion; and
   the retaining portions are disposed in opposition to the light emitting portion.

3. The connector box of claim 1, wherein:
   the annular portion includes an annular lens portion fitted to an outer side of the receptacle connector portion and a light guiding edge portion extending to an outer side in a circumferential direction from the annular lens portion;
   the upper casing incudes a receptacle connector accommodating portion for accommodating at least a portion of the receptacle connector portion;
   the lower casing includes a front face plate portion having an opening portion into which the receptacle connector portion is inserted and which opens the connector insertion opening to the outside of the casing; and
   the light guiding lens is fixed to the casing with the light guiding edge portion thereof being clamped between the front end wall and the front face plate portion.

4. The connector box of claim 2, wherein:
   the annular portion includes an annular lens portion fitted to an outer side of the receptacle connector portion and a light guiding edge portion extending to an outer side in a circumferential direction from the annular lens portion;
   the upper casing incudes a receptacle connector accommodating portion for accommodating at least a portion of the receptacle connector portion;
   the lower casing includes a front face plate portion having an opening portion into which the receptacle connector portion is inserted and which opens the connector insertion opening to the outside of the casing; and
   the light guiding lens is fixed to the casing with the light guiding edge portion thereof being clamped between the front end wall and the front face plate portion.

5. The connector box of claim 3, wherein the receptacle connector accommodating portion includes a side wall portion between a side wall portion of the receptacle connector portion and the light emitting portion.

6. The connector box of claim 4, wherein the receptacle connector accommodating portion includes a side wall portion between a side wall portion of the receptacle connector portion and the light emitting portion.

7. The connector box of claim 3, wherein:
   the annular lens portion is fitted to an inner side of the opening portion; and
   the opening portion is spaced from the annular lens portion for the entire outer circumference of the lens portion of the annular portion.

8. The connector box of claim 3, wherein the annular lens portion is spaced from the receptacle connector portion along an entire outer circumference of the receptacle connector portion.

9. The connector box of claim 1, comprising:
   the upper casing having a receptacle connector accommodating portion for accommodating at least a portion of the receptacle connector portion; and
   the receptacle connector accommodating portion having a far-side wall portion which comes into abutment against a connector rear end face which is a rear face of the receptacle connector portion.

10. The connector box of claim 9, wherein the receptacle connector accommodating portion has an upper wall portion that comes into abutment against a connector upper wall face which is an upper face of the receptacle connector portion.

11. The connector box of claim 9, wherein the receptacle connector accommodating portion has a side wall portion that comes into abutment against a connector side wall portion which is a side wall of the receptacle connector portion.

12. The connector box of claim 10, wherein the receptacle connector accommodating portion has a side wall portion that comes into abutment against a connector side wall portion which is a side wall of the receptacle connector portion.

13. The connector box of claim 9, wherein the upper casing includes a pair of flanges having a through hole.

14. The connector box of claim 1, comprising:
the lower casing having a bottom plate portion opposed to the lower face of the circuit board unit, a pair of lower side wall portions formed vertically from the bottom plate portion and a pair of first engaging portions formed in the lower side wall portions on the side opposite to the bottom plate portion; and
the lower casing holding the upper casing non-detachably in a vertical direction in association with sliding of the upper casing to one side in the front/rear direction to fit into a space surrounded by the pair of first engaging portions, the lower side wall portions and the bottom plate portion.

15. The connector box of claim 14, wherein:
the upper casing includes a top plate portion covering the circuit board unit; and
the top plate portion includes a pair of first engaged portions engageable with the pair of first engaging portions.

16. The connector box of claim 14, wherein:
the lower casing includes a front face plate portion having an opening portion into which the receptacle connector portion is inserted and which opens the connector insertion opening to the outside of the casing;
the opening portion is spaced from an entire outer circumference of the receptacle connector portion; and
the upper casing is disposed rearwardly of the front face plate portion.

17. The connector box of claim 15, wherein:
the lower casing includes a front face plate portion having an opening portion into which the receptacle connector portion is inserted and which opens the connector insertion opening to the outside of the casing;
the opening portion is spaced from an entire outer circumference of the receptacle connector portion; and
the upper casing is disposed rearwardly of the front face plate portion.

18. The connector box of claim 14, wherein:
the lower casing includes, rearwardly of the first engaging portions, a second engaging portion for holding the upper casing non-removably in the vertical direction; and
the upper casing includes a second engaged portion engageable with the second engaging portion.

* * * * *